(12) United States Patent
Tsai et al.

(10) Patent No.: US 10,381,296 B2
(45) Date of Patent: Aug. 13, 2019

(54) SEMICONDUCTOR DEVICE PACKAGE AND A METHOD OF MANUFACTURING THE SAME

(71) Applicant: Advanced Semiconductor Engineering, Inc., Kaohsiung (TW)

(72) Inventors: Li Chuan Tsai, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/699,810

(22) Filed: Sep. 8, 2017

(65) Prior Publication Data
US 2018/0254238 A1    Sep. 6, 2018

Related U.S. Application Data

(63) Continuation-in-part of application No. 15/450,598, filed on Mar. 6, 2017.

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4832* (2013.01); *H01L 21/4853* (2013.01);
(Continued)

(58) Field of Classification Search
CPC . H01L 24/17; H01L 23/5386; H01L 21/4853; H01L 23/3114; H01L 23/3128;
(Continued)

(56) References Cited

U.S. PATENT DOCUMENTS 6,534,723 B1    3/2003 Asai et al.
7,005,241 B2    2/2006 Fukase et al.
(Continued)

OTHER PUBLICATIONS

Non-Final Office Action for U.S. Appl. No. 15/450,598, dated Dec. 7, 2017.
(Continued)

*Primary Examiner* — Feifei Yeung Lopez
(74) *Attorney, Agent, or Firm* — Foley & Lardner LLP; Cliff Z. Liu

(57) ABSTRACT

At least some embodiments of the present disclosure relate to a substrate for packaging a semiconductor device. The substrate includes a first dielectric layer having a first surface, a first patterned conductive layer adjacent to the first surface of the first dielectric layer, and a conductive post. The first patterned conductive layer includes a first conductive pad and a second conductive pad. The conductive post is disposed on the first conductive pad. The conductive post includes a first portion and a second portion. The first portion and the second portion of the conductive post are exposed by the first dielectric layer. The first portion of the conductive post has a first width corresponding to a top line width of the first portion and the second portion of the conductive post has a width. The width of the second portion of the conductive post is greater than the first width of the first portion of the conductive post.

18 Claims, 21 Drawing Sheets

(51) Int. Cl.
*H05K 3/34* (2006.01)
*H05K 1/11* (2006.01)
*H01L 23/538* (2006.01)
*H01L 23/00* (2006.01)
*H01L 23/31* (2006.01)

(52) U.S. Cl.
CPC ...... *H01L 21/4857* (2013.01); *H01L 23/3114* (2013.01); *H01L 23/3128* (2013.01); *H01L 23/49822* (2013.01); *H01L 23/49894* (2013.01); *H01L 23/5386* (2013.01); *H01L 23/5389* (2013.01); *H01L 24/17* (2013.01); *H01L 24/81* (2013.01); *H05K 1/113* (2013.01); *H05K 3/3452* (2013.01); *H01L 2224/05611* (2013.01); *H01L 2224/05647* (2013.01); *H01L 2224/16227* (2013.01); *H01L 2225/0652* (2013.01); *H01L 2225/06517* (2013.01); *H01L 2225/06582* (2013.01); *H01L 2225/06586* (2013.01); *H01L 2924/181* (2013.01); *H05K 2201/09563* (2013.01)

(58) Field of Classification Search
CPC ....... H01L 23/5389; H01L 2225/06517; H01L 2225/0652; H01L 24/81; H01L 2225/06582; H01L 2225/06586
See application file for complete search history.

(56) References Cited

U.S. PATENT DOCUMENTS

| | | | |
|---|---|---|---|
| 7,038,142 B2 | 5/2006 | Abe | |
| 2001/0002728 A1* | 6/2001 | Tsukada | H05K 3/3452 257/693 |
| 2006/0292851 A1 | 12/2006 | Lin et al. | |
| 2008/0202803 A1* | 8/2008 | Nagase | H01L 23/3121 174/262 |
| 2009/0038834 A1* | 2/2009 | Itoh | C08F 283/00 174/258 |
| 2012/0006592 A1* | 1/2012 | Ouchi | H01L 23/49816 174/267 |
| 2012/0067635 A1* | 3/2012 | Nang | B23K 1/0016 174/260 |
| 2014/0332252 A1 | 11/2014 | Lin | |
| 2014/0360767 A1* | 12/2014 | Terui | H01L 24/19 174/261 |
| 2015/0115469 A1 | 4/2015 | Lee et al. | |

OTHER PUBLICATIONS

Final Office Action for U.S. Appl. No. 15/450,598, dated May 18, 2018.

* cited by examiner

SEMICONDUCTOR DEVICE PACKAGE AND A METHOD OF MANUFACTURING THE SAME

CROSS-REFERENCE TO RELATED APPLICATIONS

This application is a continuation-in-part of U.S. application Ser. No. 15/450,598, filed Mar. 6, 2017, the content of which is incorporated herein by reference in its entirety.

BACKGROUND

1. Technical Field

The present disclosure relates to a substrate for packaging a semiconductor device, and to a conductive post of a substrate including a first portion with a first width and a second portion with a second width. The first portion and the second portion of the conductive post are exposed by a dielectric layer and the second width is greater than the first width.

2. Description of the Related Art

In some semiconductor device packages, for example, a package on package (PoP) structure, an upper substrate is stacked on a lower substrate. Solder balls may be used to connect the upper substrate to the lower substrate to form the semiconductor device package. However, it may be challenging to control a size/dimension of the solder balls and this may adversely affect assembly of the upper substrate and the lower substrate. Moreover, a width and a pitch of the solder balls may be greater than desired.

Copper (Cu) pillars, which can have relatively better uniformity in height and relatively smaller width and pitch, may be used to replace the solder balls between the upper substrate and the lower substrate. However, as technologies progress, semiconductor device packages are shrinking, and a height of Cu pillars and a corresponding manufacturing process may still cause issues.

SUMMARY

In some embodiments, according to one aspect, a substrate for packaging a semiconductor device includes a first dielectric layer having a first surface, a first patterned conductive layer adjacent to the first surface of the first dielectric layer, and a conductive post. The first patterned conductive layer includes a first conductive pad and a second conductive pad. The conductive post is disposed on the first conductive pad. The conductive post includes a first portion and a second portion. The first portion and the second portion of the conductive post are exposed by the first dielectric layer. The first portion of the conductive post has a first width corresponding to a top line width of the first portion and the second portion of the conductive post has a width. The width of the second portion of the conductive post is greater than the first width of the first portion of the conductive post.

In some embodiments, according to another aspect, a semiconductor device package includes a first substrate, a semiconductor device, a second substrate, and an encapsulant disposed between the first substrate and the second substrate. The first substrate includes a first dielectric layer having a first surface, a first patterned conductive layer adjacent to the first surface of the first dielectric layer, and a conductive post. The first patterned conductive layer includes a first conductive pad adjacent to the periphery of the first substrate and a second conductive pad adjacent to the center of the first substrate. The conductive post is disposed on the first conductive pad. The conductive post includes a first portion and a second portion. The first portion and the second portion of the conductive post are exposed by the first dielectric layer. The first portion of the conductive post has a width corresponding to a top line width of the first portion and the second portion of the conductive post has a width. The width of the second portion of the conductive post is greater than the width of the first portion of the conductive post. The semiconductor device is disposed on the first substrate and electrically connected to the second conductive pad. The second substrate is electrically connected to the first conductive pad.

In some embodiments, according to another aspect, a method is disclosed for manufacturing a substrate. The method includes: providing a first dielectric layer and a first patterned conductive layer adjacent to a first surface of the first dielectric layer, the first patterned conductive layer including a first conductive pad and a second conductive pad; providing a first photoresist layer on the first dielectric layer; patterning the first photoresist layer to expose the first conductive pad; forming a second conductive layer on the patterned first photoresist layer; providing a second photoresist layer on the second conductive layer; patterning the second photoresist layer, the patterned second photoresist layer located over the first conductive pad; etching the second conductive layer to form a conductive post comprising a first portion and a second portion; and removing the patterned first photoresist layer to expose the second portion of the conductive post.

DETAILED DESCRIPTION

Figure 1A:
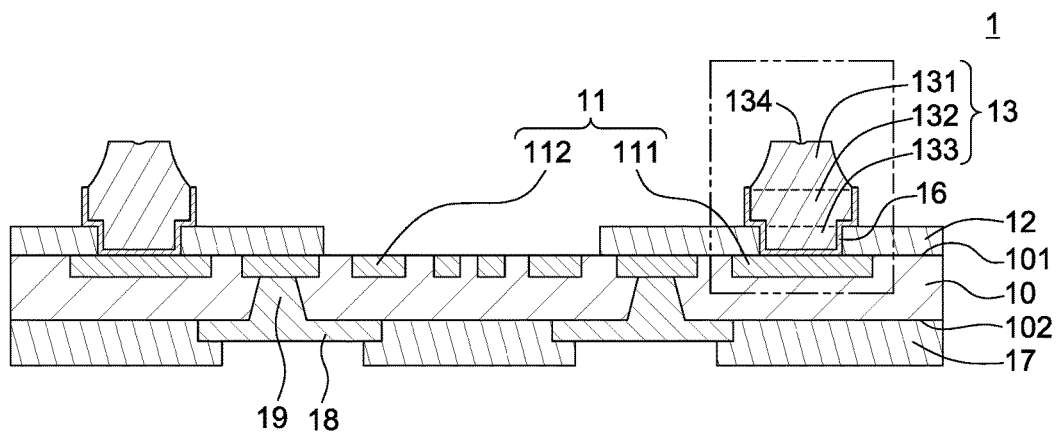
FIG. 1A illustrates a cross-sectional view of a substrate according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a substrate 1 for packaging a semiconductor device in accordance with some embodiments of the present disclosure. The substrate 1 includes a dielectric layer 10, a patterned conductive layer 11, a dielectric layer 12, a conductive post 13, a conductive layer 16, a dielectric layer 17, a patterned conductive layer 18, and an interconnection element 19.

The dielectric layer 10 has a surface 101 and a surface 102 opposite to the surface 101. The dielectric layer 10 includes a resin layer and a fiberglass.

The patterned conductive layer 11 is adjacent to the surface 101 of the dielectric layer 10. The patterned conductive layer 11 includes a conductive pad 111 and a conductive pad 112. The conductive pad 111 is adjacent to the periphery of the substrate 1. The conductive pad 112 is adjacent to the center of the substrate 1. The conductive pad 112 is closer to the center of the substrate 1 than is the conductive pad 111. Each of the conductive pad 111 and the conductive pad 112 of the patterned conductive layer 11 are embedded in the dielectric layer 10. In some embodiments, two conductive pads 112 may be surrounded by two conductive pads 111. The two conductive pads 112 may be disposed between the two conductive pads 111.

The conductive post 13 is disposed on the conductive pad 111. The conductive post 13 includes a first portion 131, a second portion 132, and a third portion 133. A portion of the top surface of the first portion 131 of the conductive post 13 defines a curved recess 134 or an indentation. The first portion 131 and the second portion 132 of the conductive post 13 are exposed by the dielectric layer 10. The first portion 131 and the second portion 132 of the conductive post 13 are exposed by the dielectric layer 12. The third portion 133 of the conductive post 13 is between the second portion 132 of the conductive post 13 and the conductive pad 111. The third portion 133 of the conductive post 13 is embedded in the dielectric layer 12. The first portion 131 of the conductive post 13 tapers from the bottom of the first portion 131 of the conductive post 13 toward the top of the first portion 131 of the conductive post 13. The conductive post 13 is electrically connected to the conductive pad 111 through the conductive layer 16. The conductive posts 13 disposed on the substrate 1 all have a substantially same height. The top surfaces of the conductive posts 13 disposed on the substrate 1 are substantially coplanar with one another.

The conductive layer 16 is a seed layer. The conductive layer 16 is disposed between the conductive post 13 and the conductive pad 111. The conductive layer 16 covers at least a portion of a sidewall of the second portion 132 of the conductive post 13 and at least a portion of a sidewall of the third portion 133 of the conductive post 13.

The patterned conductive layer 18 is adjacent to the surface 102 of the dielectric layer 10. The patterned conductive layer 18 is disposed on the surface 102 of the dielectric layer 10. The patterned conductive layer 18 is electrically connected to the patterned conductive layer 11 via the interconnection element 19. In some embodiments, the patterned conductive layer 11, the patterned conductive layer 18, the conductive layer 16, and the interconnection element 19 may include copper, a copper alloy, another metal, or other suitable materials.

The dielectric layer 12 is disposed on the surface 101 of the dielectric layer 10. The dielectric layer 12 partially covers the patterned conductive layer 11. In some embodiments, the conductive pad 111 of the patterned conductive layer 11 is partially exposed by the dielectric layer 12. The conductive pad 112 of the patterned conductive layer 11 is exposed by the dielectric layer 12. The dielectric layer 12 may include a solder mask layer (e.g. including an epoxy) or other suitable layers or materials.

The dielectric layer 17 is disposed on the surface 102 of the dielectric layer 10. The dielectric layer 17 partially covers the patterned conductive layer 18. In some embodiments, the dielectric layer 17 may include a solder mask layer (e.g. including an epoxy) or other suitable layers or materials. The materials of the dielectric layer 12 and the dielectric layer 17 may be different or the same.

Figure 1B:
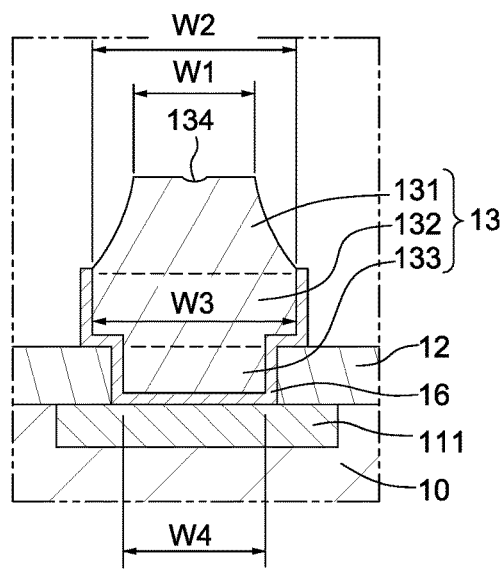
FIG. 1B illustrates a cross-sectional view of a conductive post according to some embodiments of the present disclosure.

FIG. 1B illustrates a cross-sectional view of the conductive post 13 according to some embodiments of the present disclosure, and shows an enlarged view of a region delimited by a dashed line in FIG. 1A.

The first portion 131 of the conductive post 13 has a minimum width W1 corresponding to a top line width (e.g. a width of a top surface) of the first portion 131 and a maximum width W2 corresponding to a bottom line width (e.g. a width of a bottom surface) of the first portion 131. The maximum width W2 is greater than the minimum width W1; for example, W2 may be at least about 1.1 times, at least about 1.3 times, or at least about 1.5 times W1. The width of first portion 131 of the conductive post 13 gradually lessens from the maximum width W2 to the minimum width W1 in a direction from a bottom of the first portion 131 to a top of the first portion 131 (e.g. lessens monotonically).

The second portion 132 of the conductive post 13 has a width W3. The width W3 of the second portion 132 is about equal to the maximum width W2 of the first portion 131. A ratio of the width W3 of the second portion 132 to a height of the second portion 132 is greater than about 1 or about equal to 1.

The third portion 133 of the conductive post 13 has a width W4. The width W3 of the second portion 132 is greater than the width W4 of the third portion 133; for example, W3 may be at least about 1.1 times, at least about 1.3 times, or at least about 1.5 times W4. In some embodiments, the width W4 of the third portion 133 may be about equal to the minimum width W1 of the first portion 131. The width W4 of the third portion 133 may be greater than the minimum width W1 of the first portion 131. The width W4 of the third portion 133 may be less than the minimum width W1 of the first portion 131.

Figure 2A:
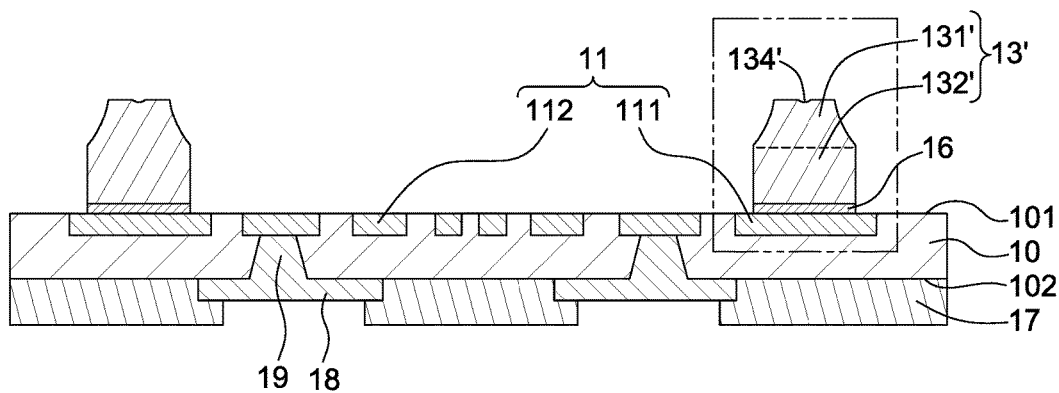
FIG. 2A illustrates a cross-sectional view of a substrate according to some embodiments of the present disclosure.

FIG. 2A is a cross-sectional view of a substrate 2 for packaging a semiconductor device in accordance with some embodiments of the present disclosure. The substrate 2 includes a dielectric layer 10, a patterned conductive layer 11, a conductive post 13', a conductive layer 16, a dielectric layer 17, a patterned conductive layer 18, and an interconnection element 19.

The dielectric layer 10 has a surface 101 and a surface 102 opposite to the surface 101. The dielectric layer 10 includes a resin layer and a fiberglass.

The patterned conductive layer 11 is adjacent to the surface 101 of the dielectric layer 10. The patterned conductive layer 11 includes a conductive pad 111 and a conductive pad 112. The conductive pad 111 is adjacent to the periphery of the substrate 2. The conductive pad 112 is adjacent to the center of the substrate 2. The conductive pad 112 is closer to the center of the substrate 2 than is the conductive pad 111. Each of the conductive pad 111 and the conductive pad 112 of the patterned conductive layer 11 are embedded in the dielectric layer 10. In some embodiments, two conductive pads 112 may surrounded by two conductive pads 111. The two conductive pads 112 may be disposed between the two conductive pads 111.

The conductive post 13' is disposed on the conductive pad 111. The conductive post 13 includes a first portion 131' and a second portion 132'. A portion of the top surface of the first portion 131' of the conductive post 13' defines a curved recess 134' or an indentation. The first portion 131' and the second portion 132' of the conductive post 13' are exposed by the dielectric layer 10. The first portion 131' of the conductive post 13' tapers from the bottom of the first portion 131' of the conductive post 13' toward the top of the first portion 131' of the conductive post 13'. The conductive post 13' is electrically connected to the conductive pad 111 through the conductive layer 16. The conductive posts 13' disposed on the substrate 2 have a substantially same height. The top surfaces of the conductive posts 13' disposed on the substrate 2 are substantially coplanar with one another.

The conductive layer 16 is a seed layer. The conductive layer 16 is disposed between the conductive post 13' and the conductive pad 111.

The patterned conductive layer 18 is adjacent to the surface 102 of the dielectric layer 10. The patterned conductive layer 18 is disposed on the surface 102 of the dielectric layer 10. The patterned conductive layer 18 is electrically connected to the patterned conductive layer 11 via the interconnection element 19. In some embodiments, the patterned conductive layers 11 and 18, the conductive layer 16, and the interconnection element 19 may include copper, a copper alloy, another metal, or other suitable materials.

The dielectric layer 17 is disposed on the surface 102 of the dielectric layer 10. The dielectric layer 17 partially covers the patterned conductive layer 18. In some embodiments, the dielectric layer 17 may include a solder mask layer (e.g. including an epoxy) or other suitable layers or materials.

Figure 2B:
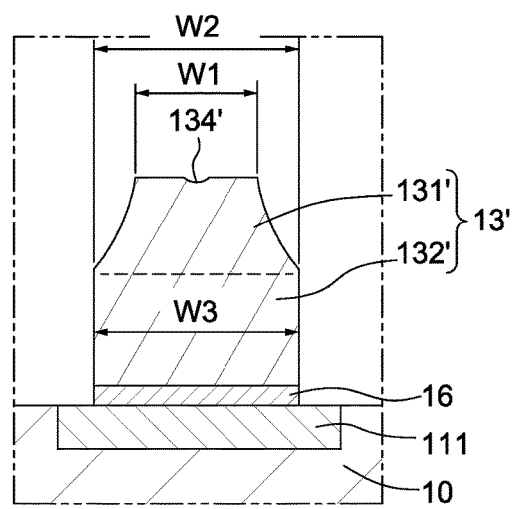
FIG. 2B illustrates a cross-sectional view of a conductive post according to some embodiments of the present disclosure.

FIG. 2B illustrates a cross-sectional view of the conductive post 13' according to some embodiments of the present disclosure, and shows an enlarged view of a region delimited by a dashed line in FIG. 2A.

The first portion 131' of the conductive post 13' has a minimum width W1 corresponding to a top line width of the first portion 131' and a maximum width W2 corresponding to a bottom line width of the first portion 131'. The maximum width W2 is greater than the minimum width W1; for example, W2 may be at least about 1.1 times, at least about 1.3 times, or at least about 1.5 times W1. The first portion 131' of the conductive post 13' gradually lessens from the maximum width W2 to the minimum width W1 in a direction from a bottom of the first portion 131' to a top of the first portion 131' (e.g. lessens monotonically).

The second portion 132' of the conductive post 13' has a width W3. The width W3 of the second portion 132' is about equal to the maximum width W2 of the first portion 131'. A ratio of the width W3 of the second portion 132' to a height of the second portion 132' is greater than about 1 or about equal to 1.

Figure 3A:
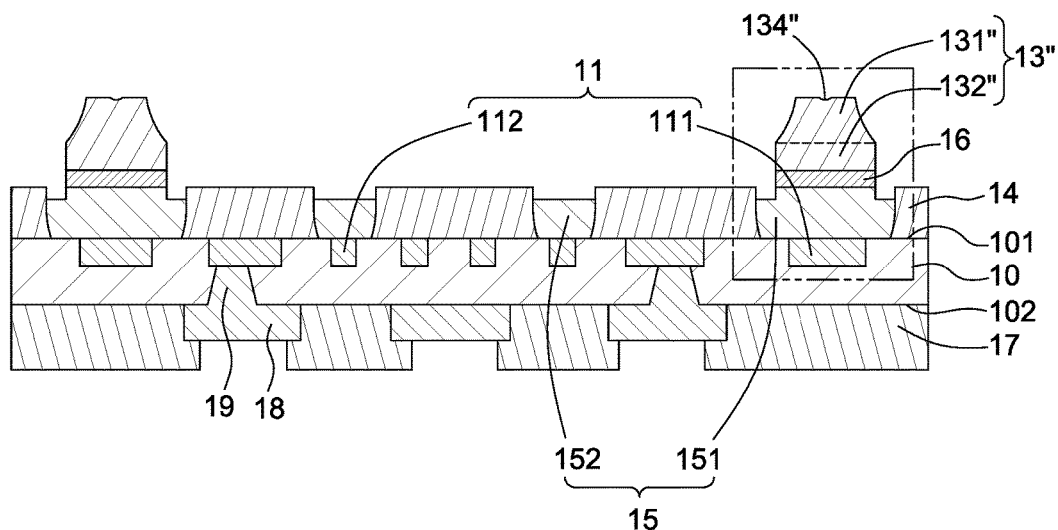
FIG. 3A illustrates a cross-sectional view of a substrate according to some embodiments of the present disclosure.

FIG. 3A is a cross-sectional view of a substrate 3 for packaging a semiconductor device in accordance with some embodiments of the present disclosure. The substrate 3 includes a dielectric layer 10, a patterned conductive layer 11, a conductive post 13", a dielectric layer 14, a patterned conductive layer 15, a conductive layer 16, a dielectric layer 17, a patterned conductive layer 18, and an interconnection element 19.

The dielectric layer 10 has a surface 101 and a surface 102 opposite to the surface 101. The dielectric layer 10 includes a resin layer and a fiberglass.

The patterned conductive layer 11 is adjacent to the surface 101 of the dielectric layer 10. The patterned conductive layer 11 includes a conductive pad 111 and a conductive pad 112. The conductive pad 111 is adjacent to the periphery of the substrate 3. The conductive pad 112 is adjacent to the center of the substrate 3. The conductive pad 112 is closer to the center of the substrate 3 than is the conductive pad 111. Each of the conductive pad 111 and the conductive pad 112 of the patterned conductive layer 11 are embedded in the dielectric layer 10. In some embodiments, two conductive pads 112 may surrounded by two conductive pads 111. The two conductive pads 112 may be disposed between the two conductive pads 111.

The dielectric layer 14 is disposed on the surface 101 of the dielectric layer 10. The dielectric layer 14 partially covers the patterned conductive layer 11. In some embodiments, the conductive pad 111 of the patterned conductive layer 11 may be completely or partially exposed by the dielectric layer 14. The conductive pad 112 of the patterned conductive layer 11 may be exposed by the dielectric layer 14. The conductive pad 112 of the patterned conductive layer 11 may be completely covered by the dielectric layer 14. The dielectric layer 14 may include a photosensitive development material (e.g. a photosensitive polyimide developer).

The patterned conductive layer 15 is adjacent to the surface 101 of the dielectric layer 10. The patterned conductive layer 15 is between the patterned conductive layer 11 and the conductive post 13". The patterned conductive layer 15 is embedded in the dielectric layer 14 (e.g. is fully embedded in the dielectric layer 14). The patterned conductive layer 15 includes a portion 151 and a portion 152. The portion 151 and the portion 152 may be bump pads. Each of the portion 151 and the portion 152 are embedded within the dielectric layer 14. The portion 151 contacts the conductive pad 111. The portion 152 contacts the conductive pad 112. In some embodiments, the top surface of the portion 151 and the top surface of the portion 152 are recessed from the top surface of the dielectric layer 14.

The conductive post 13" is disposed on the conductive pad 111. The conductive post 13" includes a first portion 131" and a second portion 132". A portion of the top surface of the first portion 131" of the conductive post 13" defines a curved recess 134" or an indentation. The first portion 131" and the second portion 132" of the conductive post 13" are exposed by the dielectric layer 10. The first portion 131" and the second portion 132" of the conductive post 13" are exposed by the dielectric layer 14. The first portion 131" of the conductive post 13" tapers from the bottom of the first portion 131" of the conductive post 13" toward the top of the first portion 131" of the conductive post 13". The conductive post 13" is electrically connected to the conductive pad 111 through the conductive layer 16 and the bump pad 151. The conductive posts 13" disposed on the substrate 3 have a same height. The top surfaces of the conductive posts 13" disposed on the substrate 3 are substantially coplanar with one another.

The conductive layer 16 is a seed layer. The conductive layer 16 is disposed between the conductive post 13" and the bump pad 151.

The patterned conductive layer 18 is adjacent to the surface 102 of the dielectric layer 10. The patterned conductive layer 18 is disposed on the surface 102 of the dielectric layer 10. The patterned conductive layer 18 is electrically connected to the patterned conductive layer 11 via the interconnection element 19. In some embodiments, the patterned conductive layers 11, 15, and 18, the conductive layer 16, and the interconnection element 19 may include copper, a copper alloy, another metal, or other suitable materials.

The dielectric layer 17 is disposed on the surface 102 of the dielectric layer 10. The dielectric layer 17 partially covers the patterned conductive layer 18. In some embodiments, the dielectric layer 17 may include a solder mask layer (e.g. including an epoxy) or other suitable layers or materials. The materials of the dielectric layer 14 and the dielectric layer 17 may be different or the same.

Figure 3B:
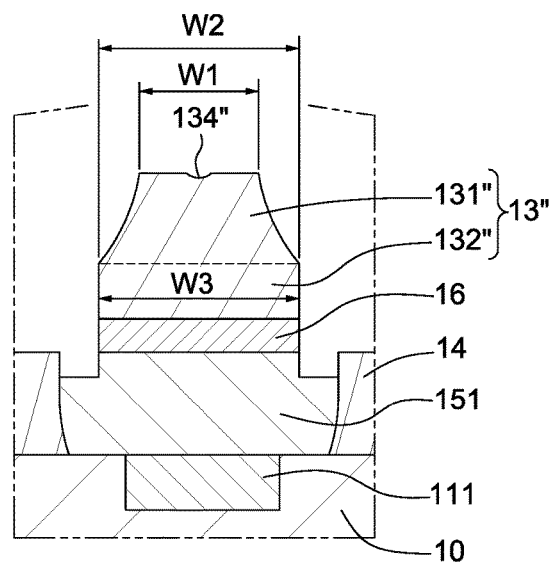
FIG. 3B illustrates a cross-sectional view of a conductive post according to some embodiments of the present disclosure.

FIG. 3B illustrates a cross-sectional view of the conductive post 13" according to some embodiments of the present disclosure, and shows an enlarged view of a region delimited by a dashed line in FIG. 3A.

The first portion 131" of the conductive post 13" has a minimum width W1 corresponding to a top line width of the first portion 131" and a maximum width W2 corresponding to a bottom line width of the first portion 131". The maximum width W2 is greater than the minimum width W1; for example, W2 may be at least about 1.1 times, at least about 1.3 times, or at least about 1.5 times W1. The first portion 131" of the conductive post 13" gradually lessens from the maximum width W2 to the minimum width W1 in a direction from a bottom of the first portion 131" to a top of the first portion 131" (e.g. lessens monotonically).

The second portion 132" of the conductive post 13 has a width W3. The width W3 of the second portion 132" is about equal to the maximum width W2 of the first portion 131". A ratio of the width W3 of the second portion 132" to a height of the second portion 132" is greater than about 1 or about equal to 1.

Figure 4A:
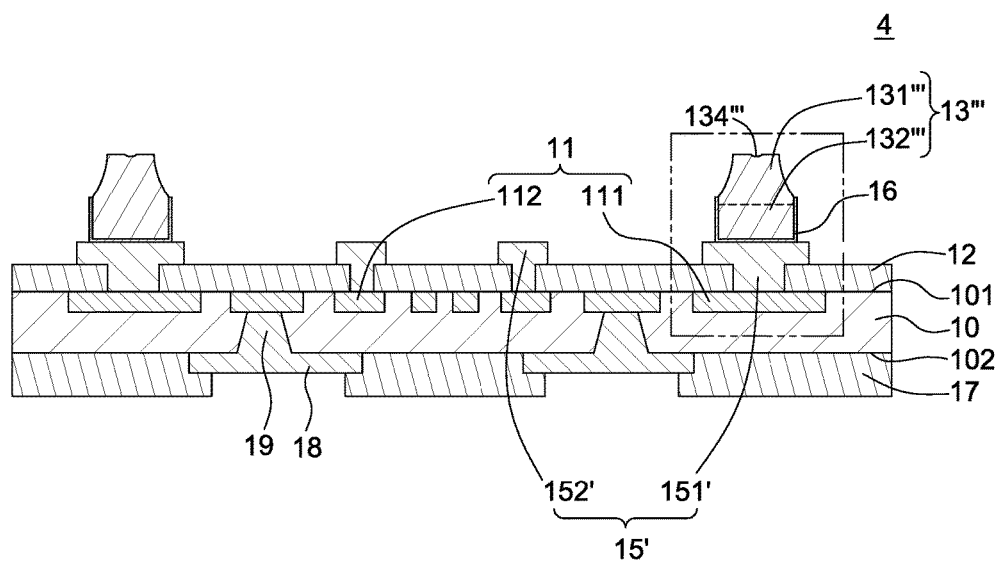
FIG. 4A illustrates a cross-sectional view of a substrate according to some embodiments of the present disclosure.

FIG. 4A is a cross-sectional view of a substrate 4 for packaging a semiconductor device in accordance with some embodiments of the present disclosure. The substrate 4 includes a dielectric layer 10, a patterned conductive layer 11, a dielectric layer 12, a conductive post 13''', a dielectric layer 15, a conductive layer 16, a dielectric layer 17, a patterned conductive layer 18, and an interconnection element 19.

The dielectric layer 10 has a surface 101 and a surface 102 opposite to the surface 101. The dielectric layer 10 includes a resin layer and a fiberglass.

The patterned conductive layer 11 is adjacent to the surface 101 of the dielectric layer 10. The patterned conductive layer 11 includes a conductive pad 111 and a conductive pad 112. The conductive pad 111 is adjacent to the periphery of the substrate 4. The conductive pad 112 is adjacent to the center of the substrate 4. The conductive pad 112 is closer to the center of the substrate 4 than is the conductive pad 111. Each of the conductive pad 111 and the conductive pad 112 of the patterned conductive layer 11 are embedded in the dielectric layer 10. In some embodiments, two conductive pads 112 may surrounded by two conductive pads 111. The two conductive pads 112 may be disposed between the two conductive pads 111.

The dielectric layer 12 is disposed on the surface 101 of the dielectric layer 10. The dielectric layer 12 partially covers the patterned conductive layer 11. In some embodiments, the conductive pad 111 of the patterned conductive layer 11 is partially exposed by the dielectric layer 12. The conductive pad 112 of the patterned conductive layer 11 is partially exposed by the dielectric layer 12. The dielectric layer 12 may include a solder mask layer (e.g. including an epoxy) or other suitable layers or materials.

The patterned conductive layer 15' is adjacent to the surface 101 of the dielectric layer 10. The patterned conductive layer 15' is between the patterned conductive layer 11 and the conductive post 13'''. The patterned conductive layer 15' includes a portion 151' and a portion 152'. Each of the portion 151' and the portion 152' of the patterned conductive layer 15 has a substantially T-shape structure. Each of the portion 151' and the portion 152' has an upper part and a lower part. The upper part of the portion 151' and the portion 152' is exposed by the dielectric layer 12. The lower part of the portion 151' and the portion 152' is embedded in the dielectric layer 12. The upper part of the portion 151' and the portion 152' is greater in size (e.g. in diameter or other lateral dimension) than the lower part of the portion 151' and the portion 152'. The portion 151' contacts the conductive pad 111. The portion 152' contacts the conductive pad 112.

The conductive post 13''' is disposed on the conductive pad 111. The conductive post 13''' includes a first portion 131''' and a second portion 132'''. A portion of the top surface of the first portion 131''' of the conductive post 13''' defines a curved recess 134''' or an indentation. The first portion 131''' and the second portion 132''' of the conductive post 13''' are exposed by the dielectric layer 10. The first portion 131''' and the second portion 132''' of the conductive post 13''' are exposed by the dielectric layer 12. The first portion 131''' of the conductive post 13''' tapers from the bottom of the first portion 131''' of the conductive post 13''' toward the top of the first portion 131''' of the conductive post 13'''. The conductive post 13''' is electrically connected to the conductive pad 111 through the conductive layer 16. The conductive posts 13''' disposed on the substrate 4 have a substantially same height. The top surfaces of the conductive posts 13''' disposed on the substrate 4 are substantially coplanar with one another.

The conductive layer 16 is a seed layer. The conductive layer 16 is disposed between the conductive post 13''' and the portion 151' of the patterned conductive layer 15'. The conductive layer 16 covers at least a portion of a sidewall of the second portion 132''' of the conductive post 13'''.

The patterned conductive layer 18 is adjacent to the surface 102 of the dielectric layer 10. The patterned conductive layer 18 is disposed on the surface 102 of the dielectric layer 10. The patterned conductive layer 18 is electrically connected to the patterned conductive layer 11 via the interconnection element 19. In some embodiments, the patterned conductive layers 11, 15, and 18, the conductive layer 16, and the interconnection element 19 may include copper, a copper alloy, another metal, or other suitable materials.

The dielectric layer 17 is disposed on the surface 102 of the dielectric layer 10. The dielectric layer 17 partially covers the patterned conductive layer 18. In some embodiments, the dielectric layer 17 may include a solder mask layer (e.g. including an epoxy) or other suitable layers or materials. The materials of the dielectric layer 14 and the dielectric layer 17 may be different or the same.

Figure 4B:
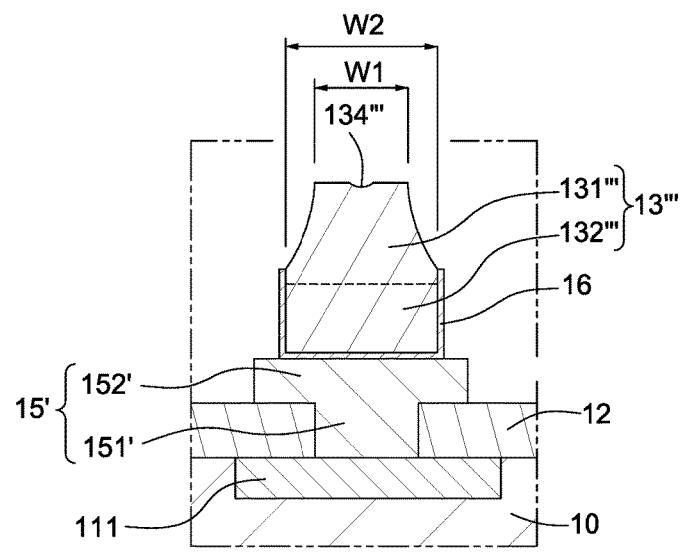
FIG. 4B illustrates a cross-sectional view of a conductive post according to some embodiments of the present disclosure.

FIG. 4B illustrates a cross-sectional view of the conductive post 13'' according to some embodiments of the present disclosure, and shows an enlarged view of a region delimited by a dashed line in FIG. 4A.

The first portion 131''' of the conductive post 13''' has a minimum width W1 corresponding to a top line width of the first portion 131''' and a maximum width W2 corresponding to a top line width of the first portion 131'''. The maximum width W2 is greater than the minimum width W1; for example, W2 may be at least about 1.1 times, at least about 1.3 times, or at least about 1.5 times W1. The first portion 131''' of the conductive post 13''' gradually lessens from the maximum width W2 to the minimum width W1 in a direction from a bottom of the first portion 131''' to a top of the first portion 131''' (e.g. lessens monotonically).

The second portion 132''' of the conductive post 13 has a width W3. The width W3 of the second portion 132''' is about equal to the maximum width W2 of the first portion 131'''. A ratio of the width W3 of the second portion 132''' to a height of the second portion 132''' is greater than about 1 or about equal to 1.

Figure 5:
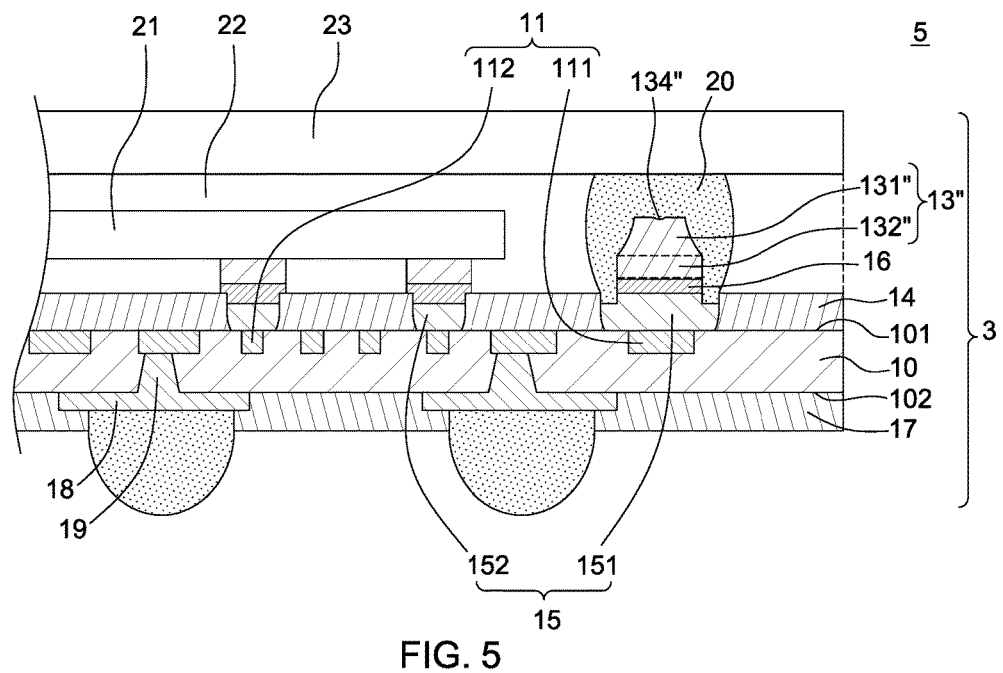
FIG. 5 illustrates a cross-sectional view of a semiconductor device package according to some embodiments of the present disclosure.

FIG. 5 is a cross-sectional view of a semiconductor device 5 in accordance with some embodiments of the present disclosure. The semiconductor device 5 includes the substrate 3 (as described above), a semiconductor device 21, a substrate 23, a connection element 20, and an encapsulant 22. It is understood that the substrate 3 may be replaced with the substrate 1, the substrate 2, or the substrate 4 described above.

The connection element 20 contacts (and, for example, electrically connects) the substrate 3 and the substrate 23. The connection element 20 electrically connects the substrate 3 to the substrate 23. The substrate 23 is electrically connected to the conductive pad 111 of the patterned conductive layer 11 of the substrate 3 through the connection element 20. The connection element 20 includes the conductive post 13''. In some embodiments, the connection element 20 may be a solder ball which contains tin (Sn) in an amount ranging from about 95 percent by weight (wt %) to about 99.8 wt %. The diameter of the connection element 20 is in a range from approximately 0.2 millimeters (mm) to approximately 0.25 mm.

The semiconductor device 21 includes pads electrically connected to the patterned conductive layer 15. The semiconductor device 21 may include a logic die. The semiconductor device 21 may include an application-specific integrated circuit (ASIC), a controller, a processor or other electronic component or semiconductor device.

The encapsulant 22 is disposed between the substrate 3 and the substrate 23. The encapsulant 22 encapsulates the connection element 20 and the semiconductor device 21.

FIG. 6A through FIG. 6G illustrate some embodiments of a method of manufacturing the substrate 1 according to some embodiments of the present disclosure. At least some of the operations described below are subtractive operations.

Figure 6A:
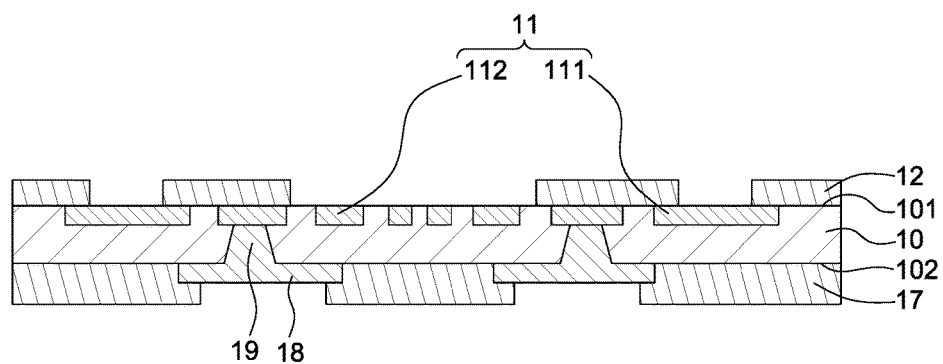
FIG. 6A illustrates a method of manufacturing a substrate according to some embodiments of the present disclosure.

Referring to FIG. 6A, a method for manufacturing the substrate 1 includes providing the dielectric layer 10 with the patterned conductive layer 11 and the patterned conductive layer 18 and the interconnection element 19. The dielectric layer 12 is disposed on the surface 101 of the dielectric layer 10 and patterned to form openings to expose the conductive pad 111 and the conductive pad 112 of the patterned conductive layer 11. The dielectric layer 17 is disposed on the surface 102 of the dielectric layer 10 and patterned to form openings to expose the patterned conductive layer 18.

Figure 6B:
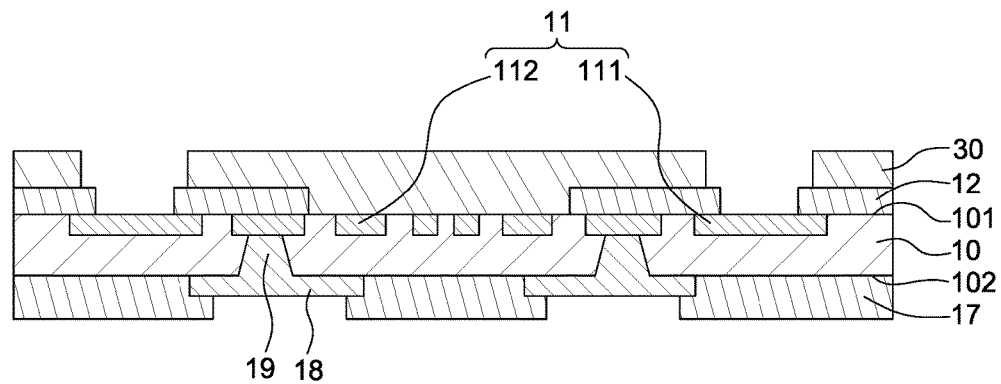
FIG. 6B illustrates a method of manufacturing a substrate according to some embodiments of the present disclosure.

Referring to FIG. 6B, a photoresist layer 30 is applied and patterned on the dielectric layer 10. The patterned photoresist layer 30 defines openings to expose the conductive pads 111 of the patterned conductive layer 11. The width of the openings of the patterned photoresist layer 30 is in a range from approximately 120 micrometers (μm) to approximately 180 μm.

Figure 6C:
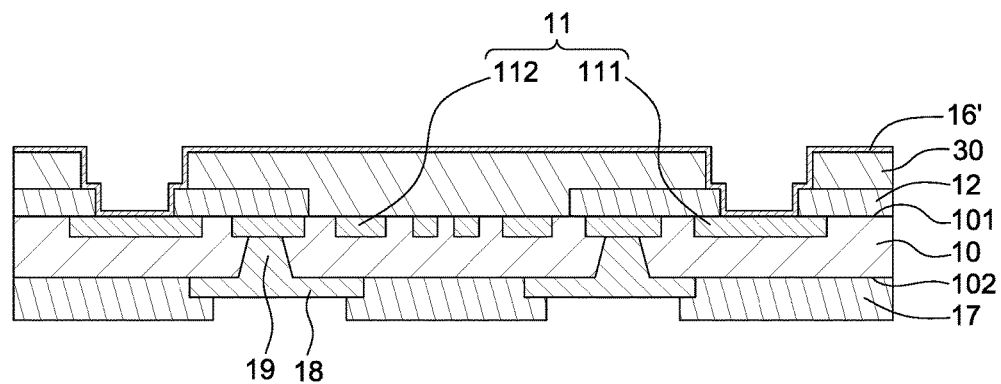
FIG. 6C illustrates a method of manufacturing a substrate according to some embodiments of the present disclosure.

Referring to FIG. 6C, the conductive layer 16' is formed over or in the openings of the patterned photoresist layer 30 and the dielectric layer 12 and the dielectric layer 10. The conductive layer 16' covers the patterned conductive layer 11. In some embodiments, the conductive layer 16' is a seed layer. The conductive layer 16' may be formed by sputtering or chemical vapor deposition (CVD) operations. The thickness of the conductive layer 16' is in a range from approximately 0.2 μm to approximately 0.8 μm.

Figure 6D:
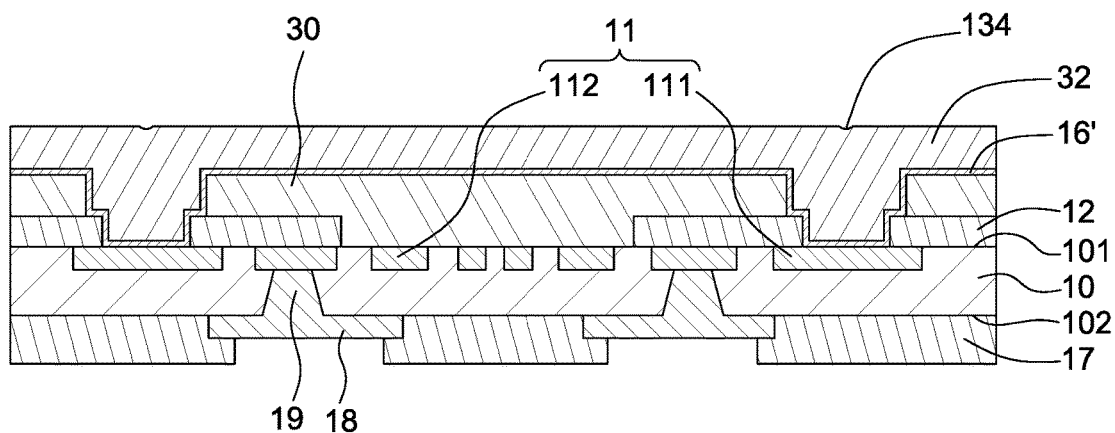
FIG. 6D illustrates a method of manufacturing a substrate according to some embodiments of the present disclosure.

Referring to FIG. 6D, a conductive layer 32 is panel-plated over the conductive layer 16'. Since the conductive layer 32 is formed by a panel plating operation, the conductive layer 32 may have a desired uniformity. During the panel plating operation, a certain position on the top surface of the conductive layer 32 corresponding to one of the openings of the patterned photoresist layer 30 (e.g. above the one of the openings of the patterned photoresist layer 30) defines a recess 134. The recess 134 may be approximately located at a position corresponding to the central region of the one of the openings of the patterned photoresist layer 30. The recess 134 has a non-zero depth in a range from approximately 0 μm to approximately 10 μm. The materials of the conductive layer 32 and the conductive layer 16' may be different or the same.

Figure 6E:
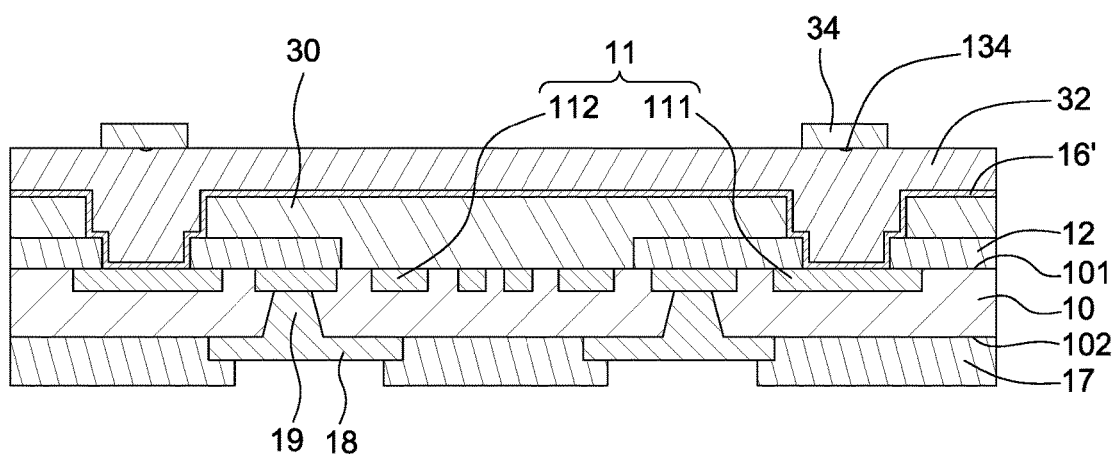
FIG. 6E illustrates a method of manufacturing a substrate according to some embodiments of the present disclosure.

Referring to FIG. 6E, a photoresist layer 34 is formed and patterned on the conductive layer 32. The patterned photoresist layer 34 covers the recess 134 and partially exposes the conductive layer 32. The patterned photoresist layer 34 is located over the conductive pad 111.

Figure 6F:
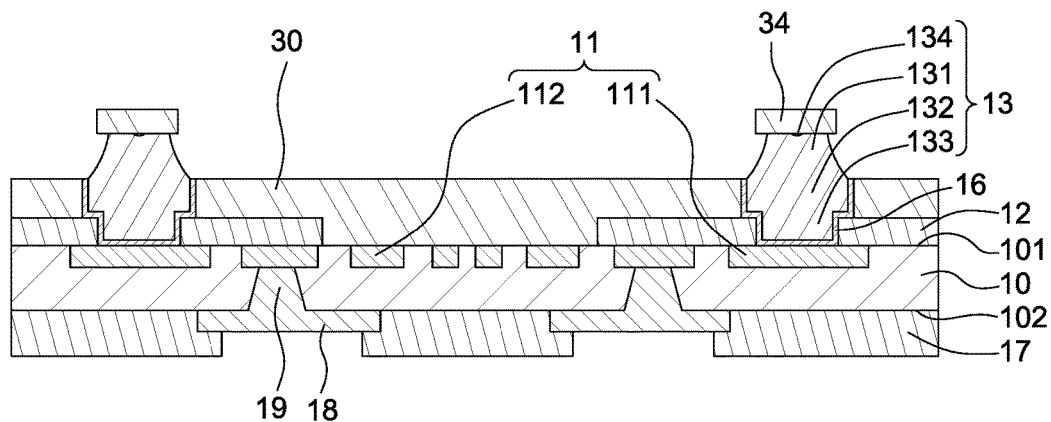
FIG. 6F illustrates a method of manufacturing a substrate according to some embodiments of the present disclosure.

Referring to FIG. 6F, the conductive layer 32 is etched to form the first portion 131 of the conductive post 13. The first portion 131 of the conductive post 13 tapers from the bottom of the first portion 131 of the conductive post 13 toward the top of the first portion 131 of the conductive post 13. Then, the conductive layer 16' on the patterned photoresist layer 30 is etched to expose the patterned photoresist layer 30 and to form the conductive layer 16.

Figure 6G:
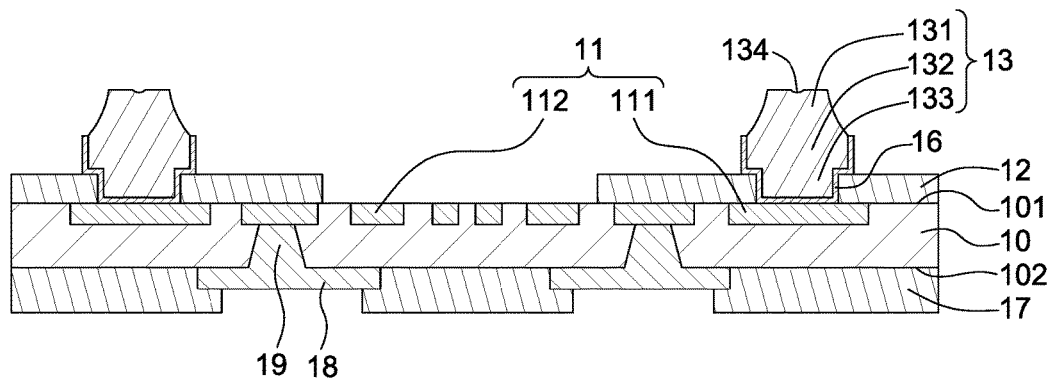
FIG. 6G illustrates a method of manufacturing a substrate according to some embodiments of the present disclosure.

Referring to FIG. 6G, the patterned photoresist layer 34 is stripped/removed to expose the top surface of the first portion 131 of the conductive post 13. The patterned photoresist layer 30 is stripped/removed to expose the conductive layer 16 on the sidewall of the second portion 132 of the conductive post 13, the dielectric layer 12, and the dielectric layer 10. The second portion 132 of the conductive post 13 may be protected by the conductive layer 16 from damage during etching operations. Thus the second portion 132 of the conductive post 13 can substantially maintain its dimensions (e.g. its width) through the etching operations. Additionally, the conductive pad 111 and the conductive pad 112 of the patterned conductive layer 11 may not be damaged during the etching operations. Thus the conductive posts 13 on the substrate 1 can have a substantially uniform height and/or width.

FIG. 7A through FIG. 7F illustrate some embodiments of a method of manufacturing the substrate 2 according to some embodiments of the present disclosure. At least some of the operations described below are subtractive operations.

Figure 7A:
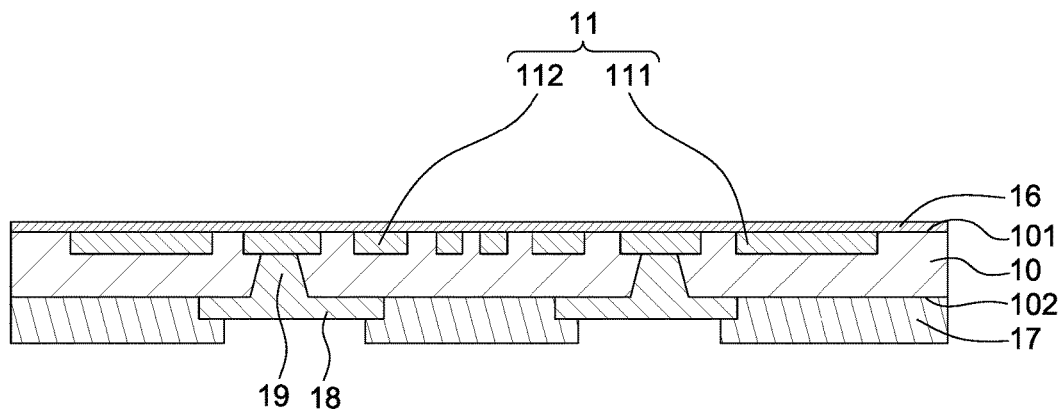
FIG. 7A illustrates a method of manufacturing a substrate according to some embodiments of the present disclosure.

Referring to FIG. 7A, a method for manufacturing the substrate 2 includes providing the dielectric layer 10 with the patterned conductive layer 11 and the patterned conductive layer 18 and the interconnection element 19. The conductive layer 16 is formed on the surface 101 of the dielectric layer 10 as a seed layer. The dielectric layer 17 is disposed on the surface 102 of the dielectric layer 10 and patterned to form openings to expose the patterned conductive layer 18. The thickness of the conductive layer 16 is in a range from approximately 2 μm to approximately 4 μm.

Figure 7B:
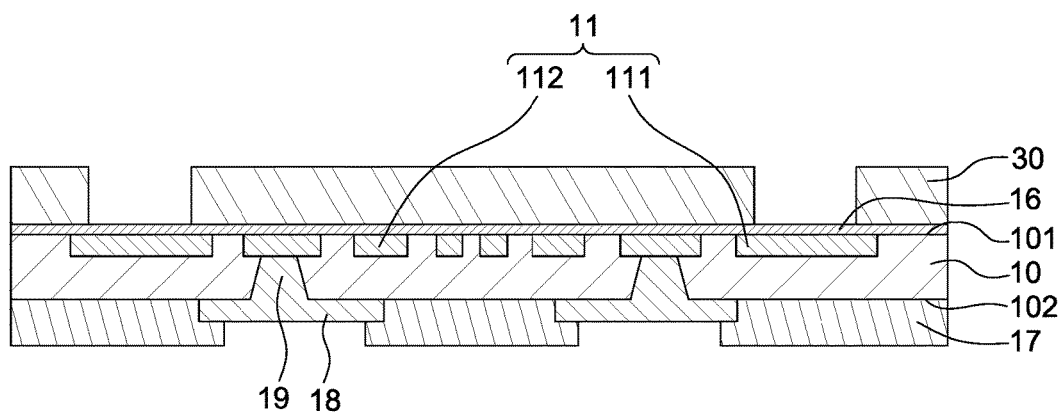
FIG. 7B illustrates a method of manufacturing a substrate according to some embodiments of the present disclosure.

Referring to FIG. 7B, a photoresist layer 30 is applied and patterned on the conductive layer 16. The patterned photoresist layer 30 defines openings to partially expose the conductive layer 16. The width of the opening of the patterned photoresist layer 30 is in a range from approximately 120 μm to approximately 180 μm. The conductive layer 16 is between the patterned photoresist layer 30 and the dielectric layer 10.

Figure 7C:
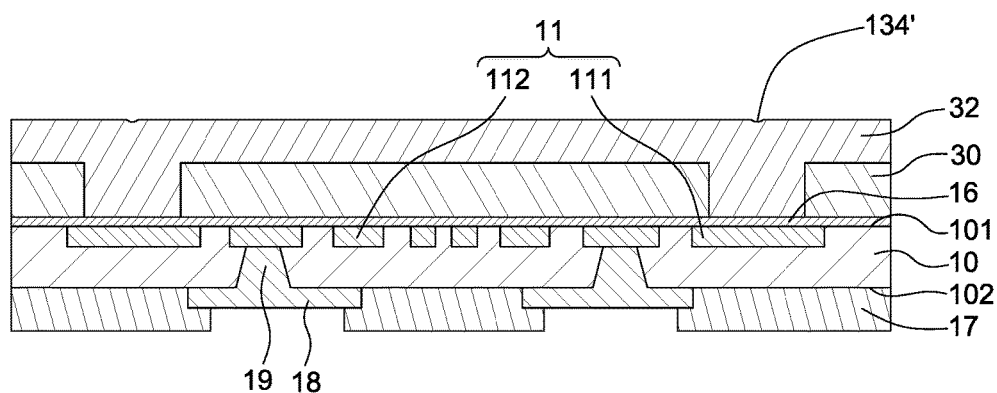
FIG. 7C illustrates a method of manufacturing a substrate according to some embodiments of the present disclosure.

Referring to FIG. 7C, a conductive layer 32 is panel-plated over the patterned photoresist layer 30 and the conductive layer 16'. Since the conductive layer 32 is formed by a panel plating operation, the conductive layer 32 may have a desired uniformity. During the panel plating operation, a certain position on the top surface of the conductive layer 32 corresponding to one of the openings of the patterned photoresist layer 30 (e.g. above the one of the openings of the patterned photoresist layer 30) defines a recess 134'. The recess 134' may be approximately located at the position corresponding to the central region of the opening of the patterned photoresist layer 30. The recess 134' has a non-zero depth in a range from approximately 0 μm to approximately 10 μm. The materials of the conductive layer 32 and the conductive layer 16 may be different or the same.

Figure 7D:
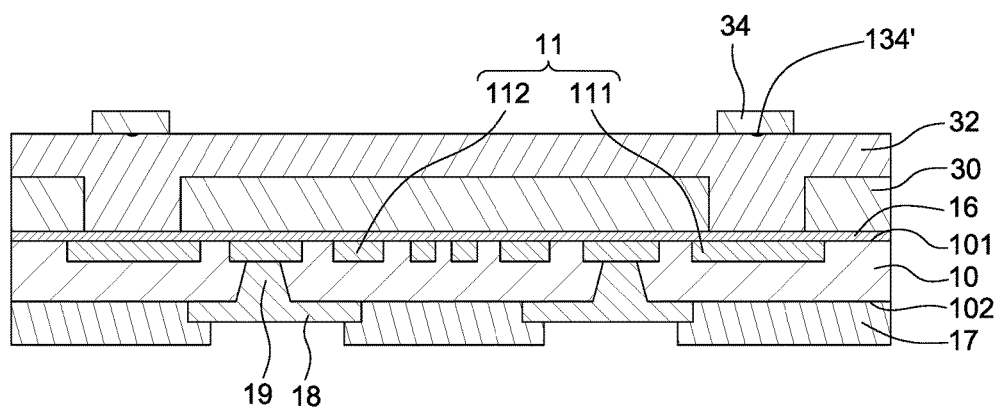
FIG. 7D illustrates a method of manufacturing a substrate according to some embodiments of the present disclosure.

Referring to FIG. 7D, a photoresist layer 34 is formed and patterned on the conductive layer 32. The patterned photoresist layer 34 covers the recess 134' and partially exposes the conductive layer 32. The patterned photoresist layer 34 is located over the conductive pad 111.

Figure 7E:
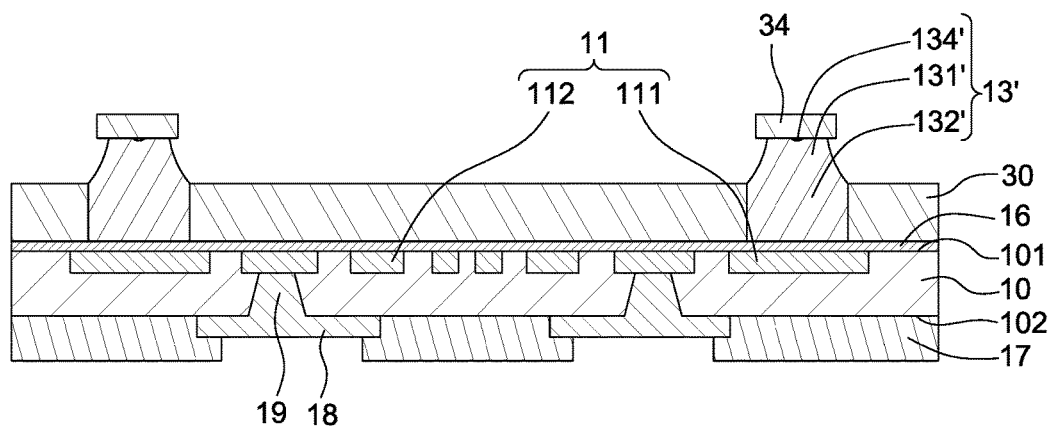
FIG. 7E illustrates a method of manufacturing a substrate according to some embodiments of the present disclosure.

Referring to FIG. 7E, the conductive layer 32 is etched to form the first portion 131' of the conductive post 13'. The first portion 131' of the conductive post 13' tapers from the bottom of the first portion 131' of the conductive post 13' toward the top of the first portion 131' of the conductive post 13'.

Figure 7F:
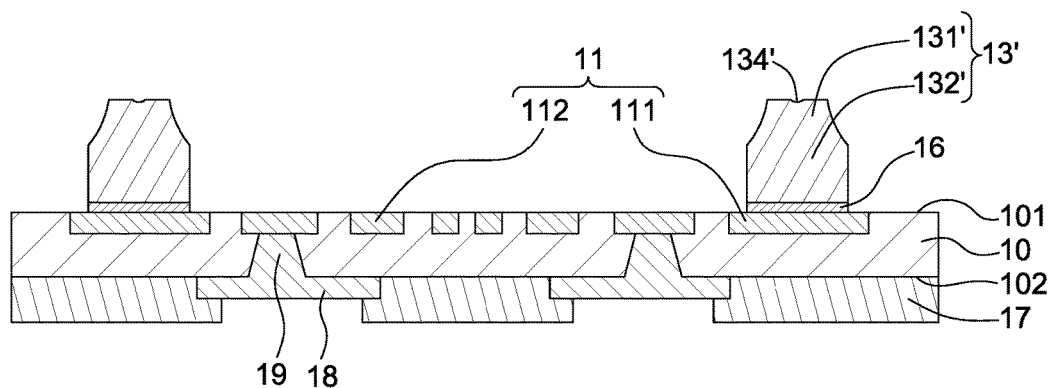
FIG. 7F illustrates a method of manufacturing a substrate according to some embodiments of the present disclosure.

Referring to FIG. 7F, the patterned photoresist layer 34 is removed to expose the top surface of the first portion 131' of the conductive post 13'. The patterned photoresist layer 30 is removed to expose the second portion 132' of the conductive post 13', the conductive layer 16, and the dielectric layer 10. Then, the conductive layer 16 is etched to expose the patterned conductive layer 11. Since the thickness of the conductive layer 16 is small, the operation time of the etching operation for the conductive layer 16 is short. The second portion 132' of the conductive post 13' substantially maintains its dimension (e.g. its width) through the etching operations. Additionally, the conductive pad 111 and the conductive pad 112 of the patterned conductive layer 11 also maintain their dimensions (e.g. widths). The conductive posts 13' on the substrate 2 can thus have substantially uniform heights.

FIG. 8A through FIG. 8F illustrate some embodiments of a method of manufacturing the substrate 3 according to some embodiments of the present disclosure. At least some of the operations described below are subtractive operations.

Figure 8A:
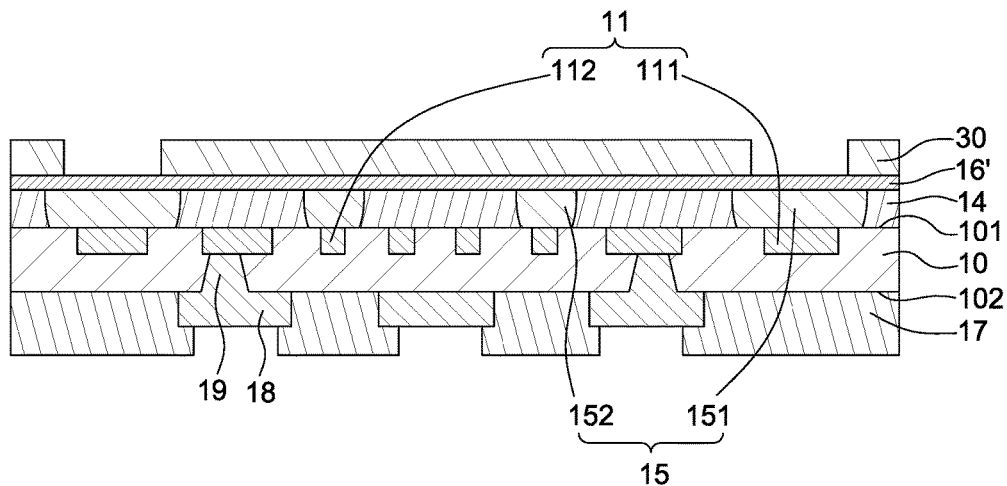
FIG. 8A illustrates a method of manufacturing a substrate according to some embodiments of the present disclosure.

Referring to FIG. 8A, a method for manufacturing the substrate 3 includes providing the dielectric layer 10 with the patterned conductive layer 11 and the patterned conductive layer 18 and the interconnection element 19. The dielectric layer 14 is disposed on the surface 101 of the dielectric layer 10. The dielectric layer 14 defines openings to expose the conductive pads 111 and 112 of the patterned conductive layer 11. The patterned conductive layer 15 is formed in the openings. The portions 151 of the patterned conductive layer 15 are formed in the openings which expose the conductive pads 111. The portions 152 of the patterned conductive layer 15 are formed in the openings which expose the conductive pads 112. The top surfaces of the portion 151 and the portion 152 are substantially coplanar with the top surface of the dielectric layer 14. The dielectric layer 17 is disposed on the surface 102 of the dielectric layer 10 and patterned to expose the patterned conductive layer 18. The conductive layer 16' is formed on the dielectric layer 14 and the patterned conductive layer 15. The thickness of the conductive layer 16' is in a range from approximately 2 µm to approximately 4 µm. A photoresist layer 30 is applied and patterned on the conductive layer 16'. The width of the opening of the patterned photoresist layer 30 is in a range from approximately 120 µm to approximately 180 µm. The conductive layer 16' is between the patterned photoresist layer 30 and the dielectric layer 10.

Figure 8B:
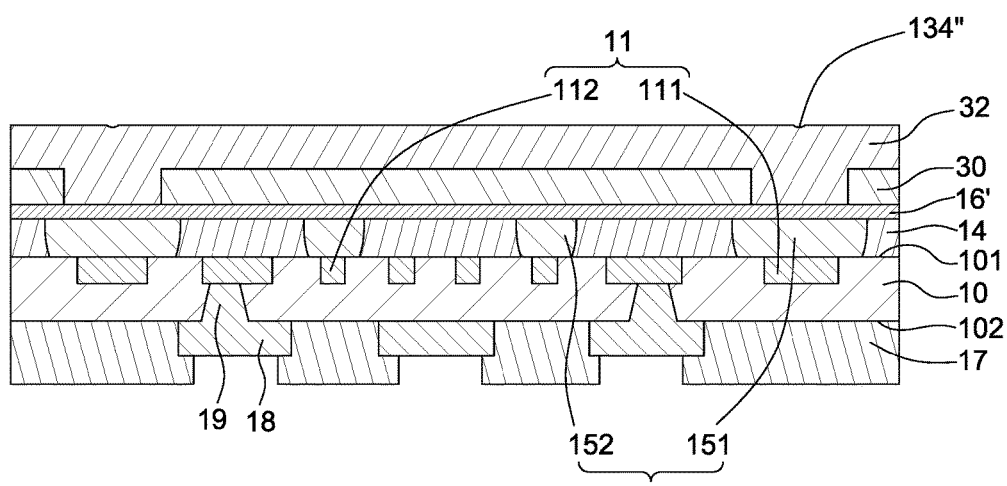
FIG. 8B illustrates a method of manufacturing a substrate according to some embodiments of the present disclosure.

Referring to FIG. 8B, a conductive layer 32 is panel-plated over the patterned photoresist layer 30 and the conductive layer 16'. Since the conductive layer 32 is formed by a panel plating operation, the conductive layer 32 may have a desired uniformity. During the panel plating operation, a certain position on the top surface of the conductive layer 32 corresponding to one of the openings of the patterned photoresist layer 30 (e.g. above the one of the openings of the patterned photoresist layer 30) defines a recess 134". The recess 134" may substantially be located at the position corresponding to the central region of the opening of the patterned photoresist layer 30. The recess 134" has a non-zero depth in a range from approximately 0 µm to approximately 10 µm. The materials of the conductive layer 32 and the conductive layer 16 may be different or the same.

Figure 8C:
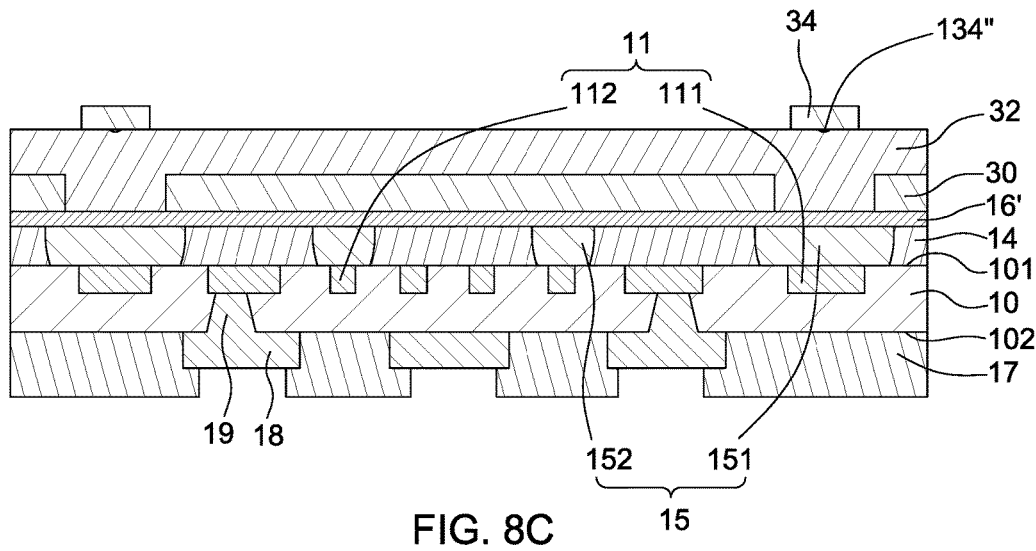
FIG. 8C illustrates a method of manufacturing a substrate according to some embodiments of the present disclosure.

Referring to FIG. 8C, a photoresist layer 34 is formed and patterned on the conductive layer 32. The patterned photoresist layer 34 covers the recess 134" and partially exposes the conductive layer 32. The patterned photoresist layer 34 is located over the conductive pad 111.

Figure 8D:
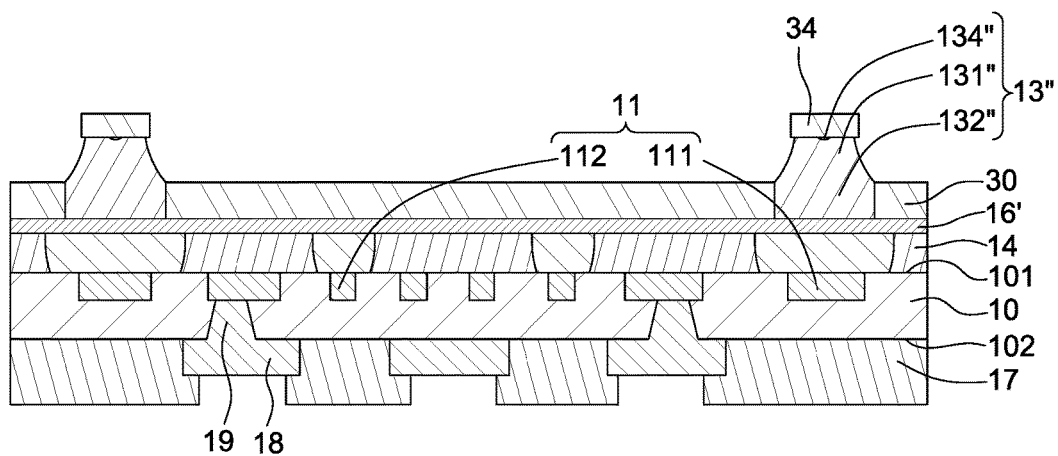
FIG. 8D illustrates a method of manufacturing a substrate according to some embodiments of the present disclosure.

Referring to FIG. 8D, the conductive layer 32 is etched to form the first portion 131" of the conductive post 13". The first portion 131" of the conductive post 13" tapers from the bottom of the first portion 131" of the conductive post 13" toward the top of the first portion 131" of the conductive post 13".

Figure 8E:
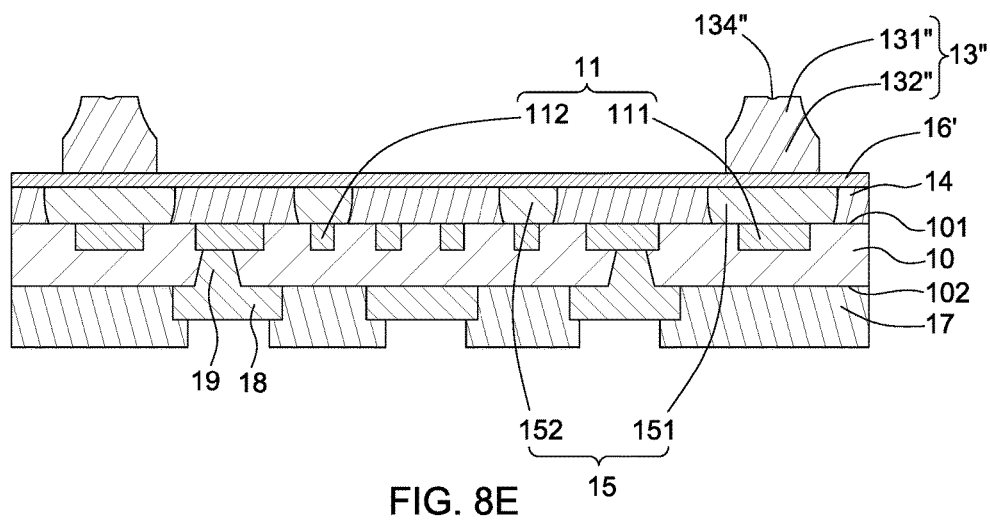
FIG. 8E illustrates a method of manufacturing a substrate according to some embodiments of the present disclosure.

Referring to FIG. 8E, the patterned photoresist layer 34 is removed to expose the top surface of the first portion 131" of the conductive post 13". The patterned photoresist layer 30 is removed to expose the conductive layer 16' and the second portion 132" of the conductive post 13".

Figure 8F:
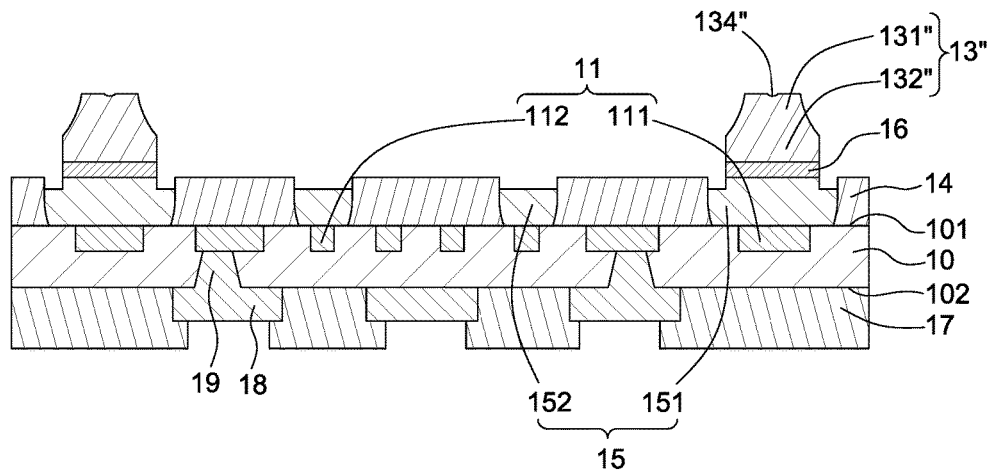
FIG. 8F illustrates a method of manufacturing a substrate according to some embodiments of the present disclosure.

Referring to FIG. 8F, the conductive layer 16' is etched to expose the dielectric layer 14 and to form the conductive layer 16. The portion 151 and the portion 152 of the patterned conductive layer 15 are slightly over-etched. The top surfaces of the portion 151 and the portion 152 are recessed from the top surface of the dielectric layer 14. The second portion 132" of the conductive post 13" substantially maintains its dimensions (e.g. its width) through the etching processes. The conductive posts 13" on the substrate 3 can thus have substantially uniform heights.

FIG. 9A through FIG. 9F illustrate some embodiments of a method of manufacturing the substrate 4 according to some embodiments of the present disclosure. At least some of the operations described below are subtractive operations.

Figure 9A:
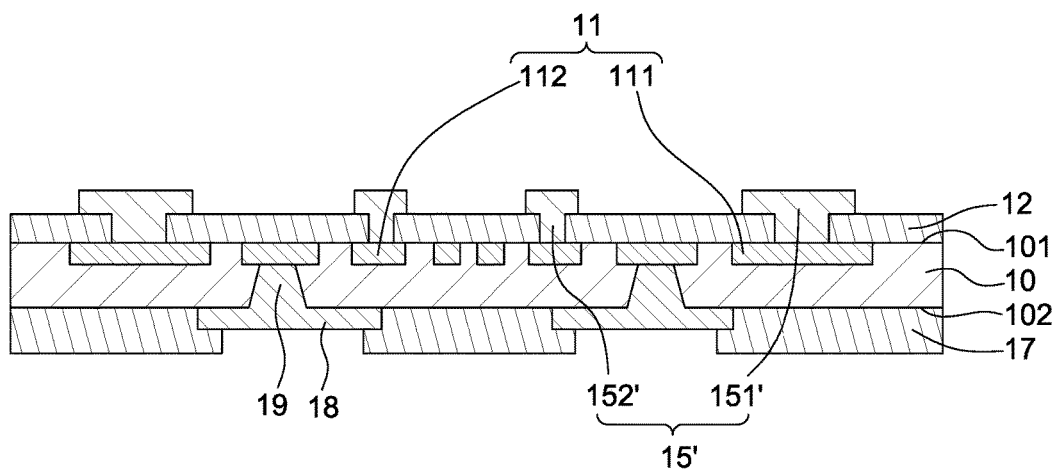
FIG. 9A illustrates a method of manufacturing a substrate according to some embodiments of the present disclosure.

Referring to FIG. 9A, a method for manufacturing the substrate 3 includes providing the dielectric layer 10 with the patterned conductive layer 11 and the patterned conductive layer 18 and the interconnection element 19. The dielectric layer 12 is disposed on the surface 101 of the dielectric layer 10. The dielectric layer 12 defines openings to expose the conductive pads 111 and 112 of the patterned conductive layer 11. The patterned conductive layer 15' is formed in the openings. The portions 151' of the patterned conductive layer 15' are formed in the openings which expose the conductive pads 111. The portions 152' of the patterned conductive layer 15' are formed in the openings which expose the conductive pads 112. The patterned conductive layer 15' has a substantially T-shape structure. The dielectric layer 17 is disposed on the surface 102 of the dielectric layer 10 and patterned to expose the patterned conductive layer 18.

Figure 9B:
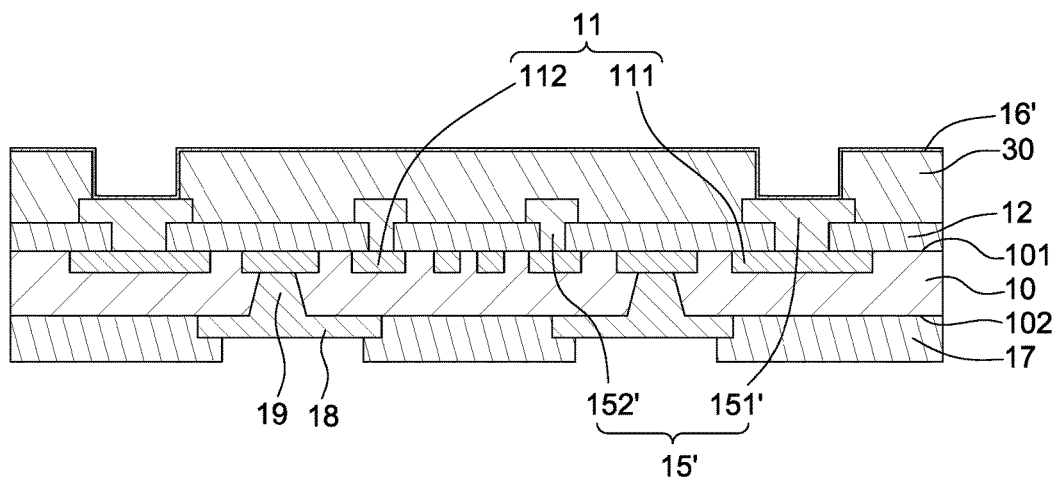
FIG. 9B illustrates a method of manufacturing a substrate according to some embodiments of the present disclosure.

Referring to FIG. 9B, a photoresist layer 30 is applied and patterned on the dielectric layer 12 to expose the portions 151' of the patterned conductive layer 15'. The width of the opening of the patterned photoresist layer 30 is in a range from approximately 120 µm to approximately 180 µm. A conductive layer 16' is formed on the patterned photoresist layer 30 and the patterned conductive layer 15' as a seed layer. The thickness of the conductive layer 16' is in a range from approximately 0.2 µm to approximately 0.8 µm.

Figure 9C:
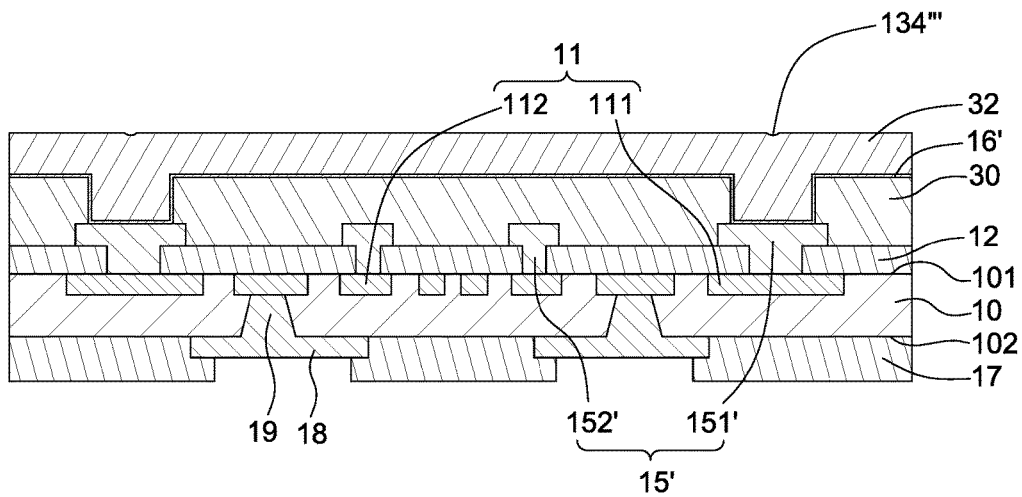
FIG. 9C illustrates a method of manufacturing a substrate according to some embodiments of the present disclosure.

Referring to FIG. 9C, a conductive layer 32 is panel-plated over the conductive layer 16'. Since the conductive layer 32 is formed by a panel plating operation, the conductive layer 32 may have a desired uniformity. During the panel plating operation, a certain position on the top surface of the conductive layer 32 corresponding to one of the openings of the patterned photoresist layer 30 (e.g. above the one of the openings of the patterned photoresist layer 30) defines a recess 134'". The recess 134'" may be approximately located at the position corresponding to the central region of the opening of the patterned photoresist layer 30. The recess 134'" has a non-zero depth in a range from approximately 0 µm to approximately 10 µm. The materials of the conductive layer 32 and the conductive layer 16' may be different or the same.

Figure 9D:
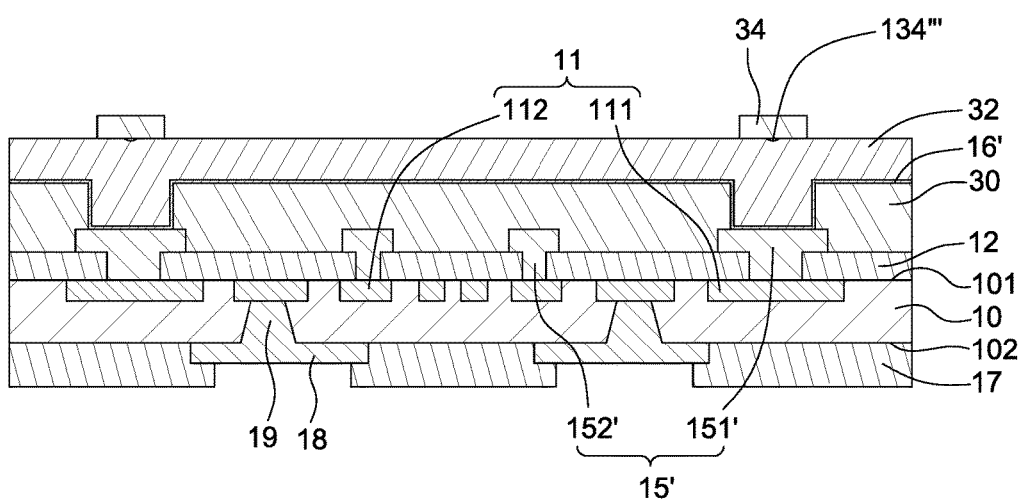
FIG. 9D illustrates a method of manufacturing a substrate according to some embodiments of the present disclosure.

Referring to FIG. 9D, a photoresist layer 34 is formed and patterned on the conductive layer 32. The patterned photoresist layer 34 covers the recess 134'" and partially exposes the conductive layer 32. The patterned photoresist layer 34 is located over the conductive pad 111.

Figure 9E:
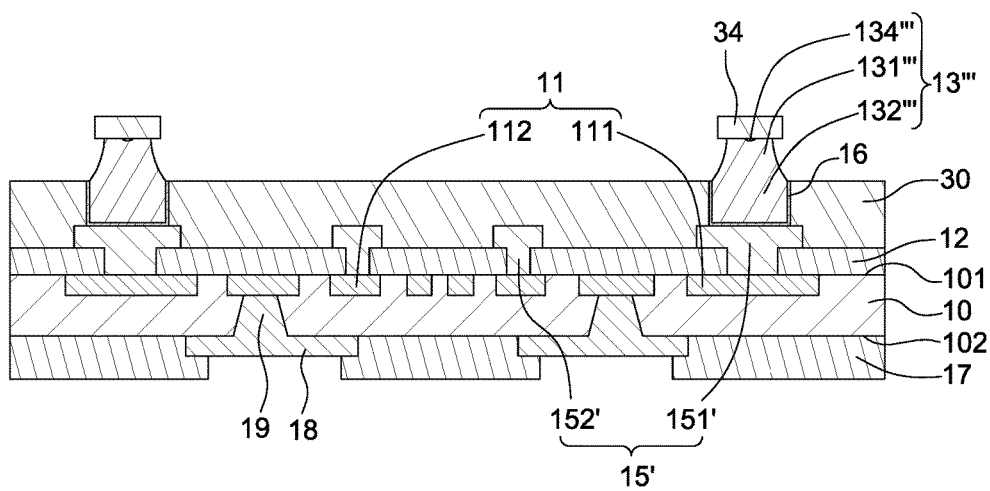
FIG. 9E illustrates a method of manufacturing a substrate according to some embodiments of the present disclosure.

Referring to FIG. 9E, the conductive layer 32 is etched to form the first portion 131'" of the conductive post 13'". The first portion 131'" of the conductive post 13'" tapers from the bottom of the first portion 131'" of the conductive post 13'" toward the top of the first portion 131'" of the conductive post 13'". Then, the conductive layer 16' on the patterned photoresist layer 30 is etched to expose the patterned photoresist layer 30 and to form the conductive layer 16.

Figure 9F:
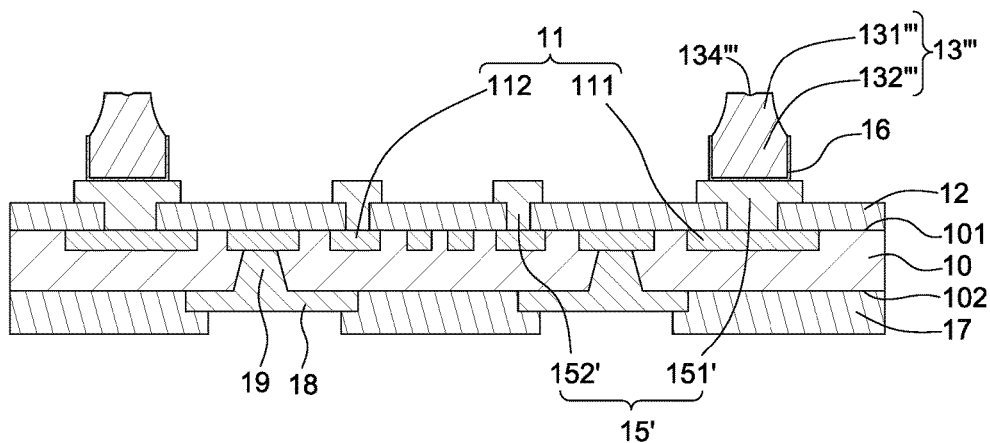
FIG. 9F illustrates a method of manufacturing a substrate according to some embodiments of the present disclosure.

Referring to FIG. 9F, the patterned photoresist layer 34 is removed to expose the top surface of the first portion 131'" of the conductive post 13'". The patterned photoresist layer 30 is removed to expose the conductive layer 16, the patterned conductive layer 15', and the dielectric layer 12.

FIG. 10A through FIG. 10D illustrate a comparative example of a method of manufacturing a substrate. One or more of the operations described below are additive operations.

Figure 10A:
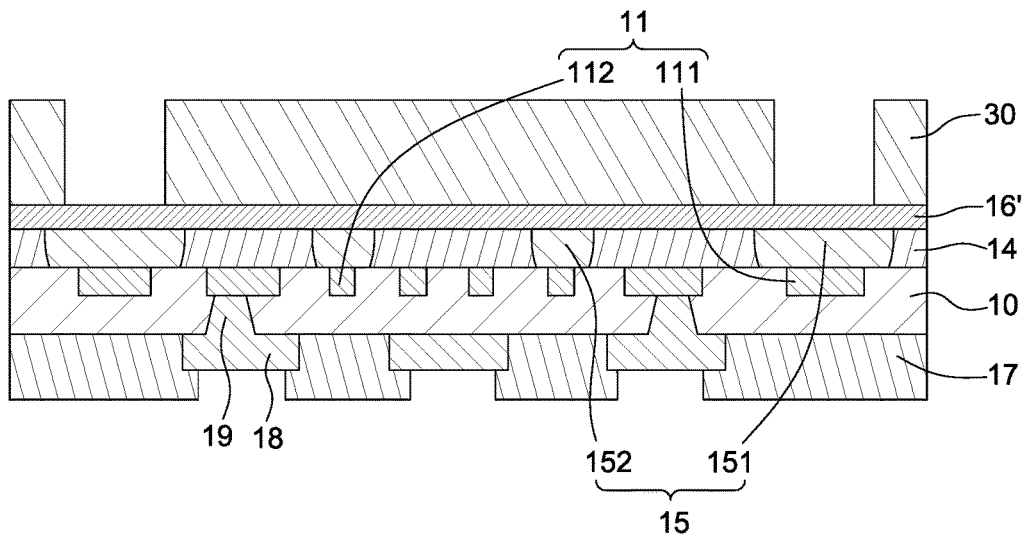
FIG. 10A illustrates a method of manufacturing a substrate according to a comparative example.

Referring to FIG. 10A, a method for manufacturing the substrate includes providing the dielectric layer 10 with the patterned conductive layer 11 and the patterned conductive layer 18 and the interconnection element 19. The dielectric layer 14 is disposed on the surface 101 of the dielectric layer 10. The dielectric layer 14 defines openings to expose the conductive pads 111 and 112 of the patterned conductive layer 11. The patterned conductive layer 15 is formed in the openings. The portions 151 of the patterned conductive layer 15 are formed in the openings which expose the conductive pads 111. The portions 152 of the patterned conductive layer 15 are formed in the openings which expose the conductive pads 112. The top surfaces of the portion 151 and the portion 152 are substantially coplanar with the top surface of the dielectric layer 14. The dielectric layer 17 is disposed on the surface 102 of the dielectric layer 10 and patterned to expose the patterned conductive layer 18. The conductive layer 16' is formed on the dielectric layer 14 and the patterned conductive layer 15. The thickness of the conductive layer 16' is in a range from approximately 2 µm to approximately 4 µm. A photoresist layer 30 is applied and patterned on the conductive layer 16'. The width of the opening of the patterned photoresist layer 30 is in a range from approximately 120 µm to approximately 180 µm. The conductive layer 16' is between the patterned photoresist layer 30 and the dielectric layer 10.

Figure 10B:
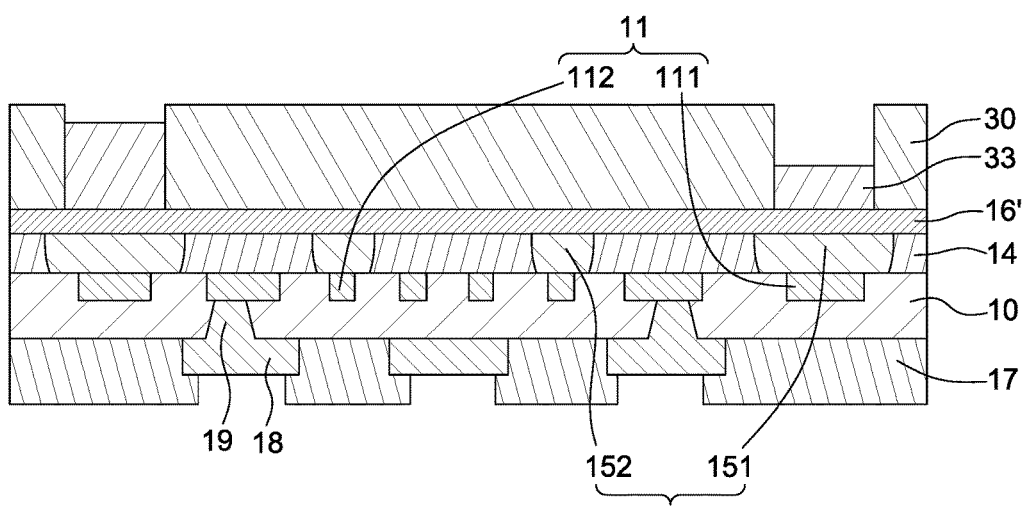
FIG. 10B illustrates a method of manufacturing a substrate according to a comparative example.

Referring to FIG. 10B, conductive posts 33 are pattern-plated in the openings of the patterned photoresist layer 30. Since the conductive posts 33 are formed by a pattern plating operation, the conductive posts 33 may not be uniform. The thicknesses of the conductive posts 33 may be significantly different from each other.

Figure 10C:
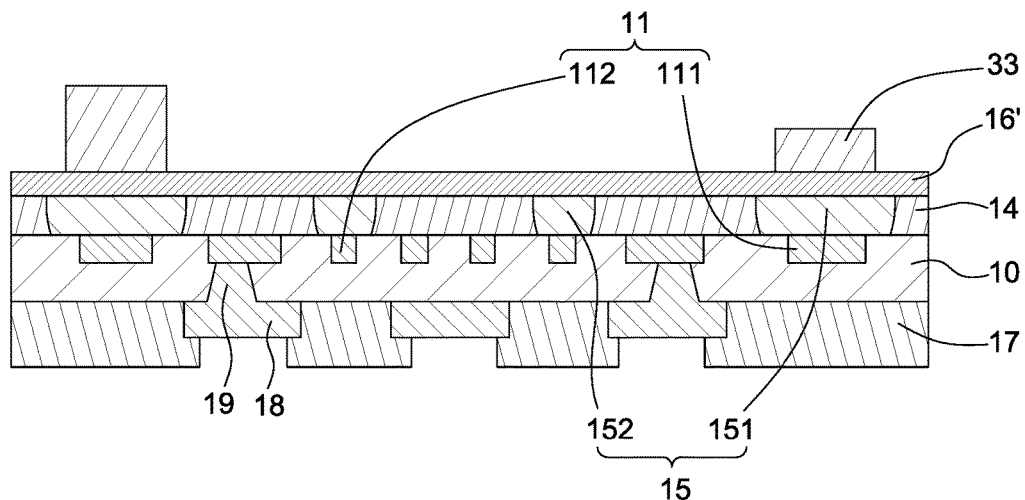
FIG. 10C illustrates a method of manufacturing a substrate according to a comparative example.

Referring to FIG. 10C, the patterned photoresist layer 30 is removed to expose the conductive posts 33 and the conductive layer 16'.

Figure 10D:
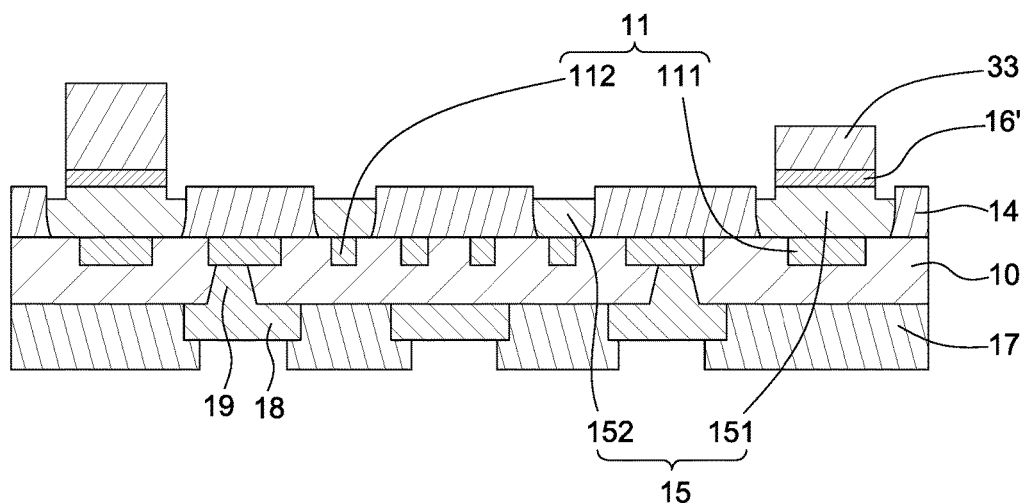
FIG. 10D illustrates a method of manufacturing a substrate according to a comparative example.

Referring to FIG. 10D, the conductive layer 16' is etched to expose the dielectric layer 14. The portion 151 and the portion 152 of the patterned conductive layer 15 are slightly over-etched. The top surfaces of the portion 151 and the portion 152 are recessed from the top surface of the dielectric layer 14.

FIG. 11A through FIG. 11D illustrate a comparative example of a method of manufacturing a substrate. At least some of the operations described below are subtractive operations.

Figure 11A:
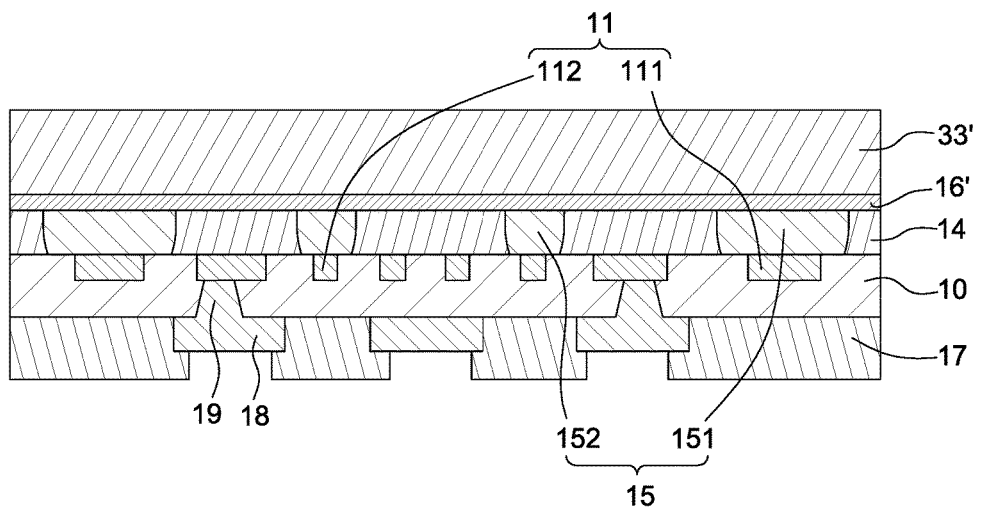
FIG. 11A illustrates a method of manufacturing a substrate according to a comparative example.

Referring to FIG. 11A, a method for manufacturing the substrate includes providing the dielectric layer 10 with the patterned conductive layer 11 and the patterned conductive layer 18 and the interconnection element 19. The dielectric layer 14 is disposed on the surface 101 of the dielectric layer 10. The dielectric layer 14 defines openings to expose the conductive pads 111 and 112 of the patterned conductive layer 11. The patterned conductive layer 15 is formed in the openings. The portions 151 of the patterned conductive layer 15 are formed in the openings which expose the conductive pads 111. The portions 152 of the patterned conductive layer 15 are formed in the openings which expose the conductive pads 112. The top surfaces of the portion 151 and the portion 152 are substantially coplanar with the top surface of the dielectric layer 14. The dielectric layer 17 is disposed on the surface 102 of the dielectric layer 10 and patterned to expose the patterned conductive layer 18. The conductive layer 16' is formed on the dielectric layer 14 and the patterned conductive layer 15. The thickness of the conductive layer 16' is in a range from approximately 2 µm to approximately 4 µm. A conductive layer 33' is panel-plated on the conductive layer 16'.

Figure 11B:
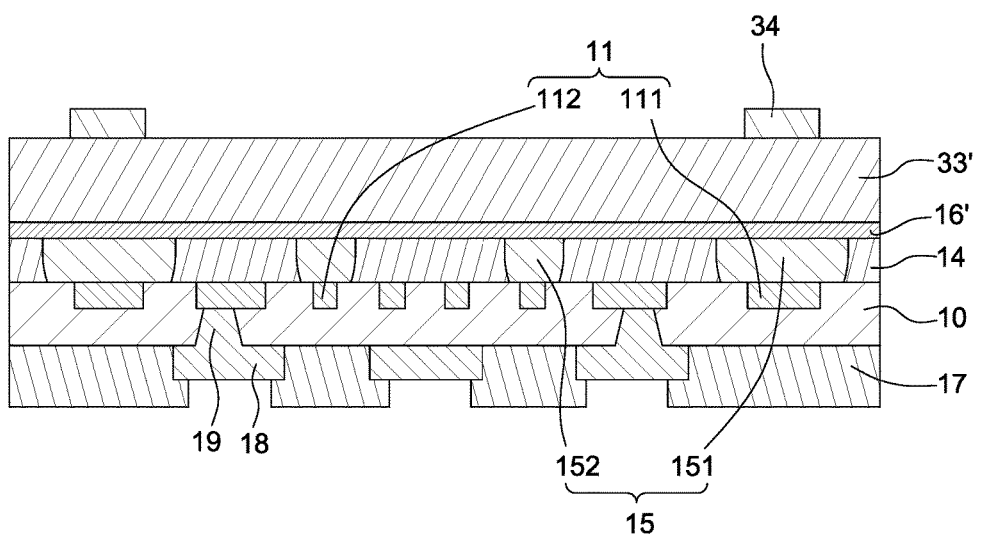
FIG. 11B illustrates a method of manufacturing a substrate according to a comparative example.

Referring to FIG. 11B, a photoresist layer 34 is formed and patterned on the conductive layer 33'.

Figure 11C:
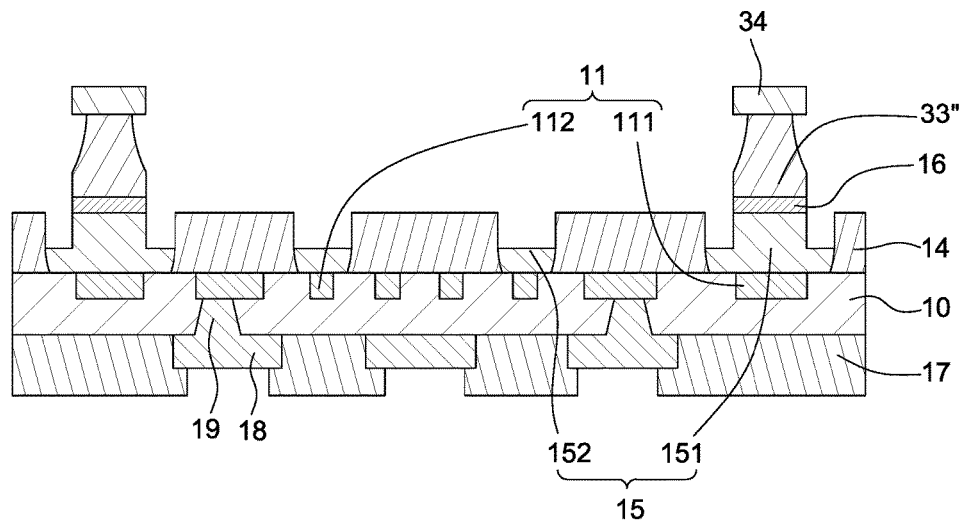
FIG. 11C illustrates a method of manufacturing a substrate according to a comparative example.

Referring to FIG. 11C, the conductive layer 33' is etched to form a conductive post 33" by an etching operation. The conductive layer 16' may be etched during the same etching operation. The sidewall of the conductive post 33" has a curved shape. The portion 151 and the portion 152 of the patterned conductive layer 15 are over-etched during the same etching operation. Since it is challenging to precisely control such an etching operation, the width of the conductive post 33" may be thinner than desired and that the thicknesses of the portion 151 and the portion 152 of the patterned conductive layer 15 may be smaller than desired.

Figure 11D:
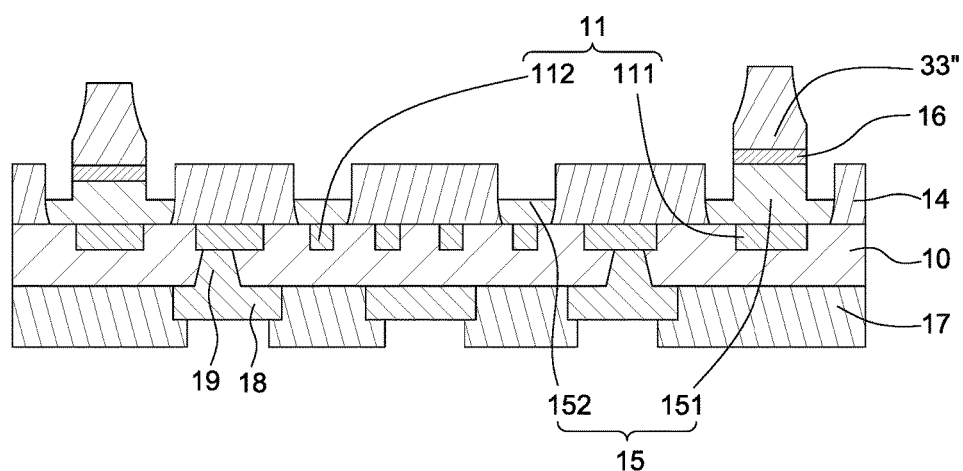
FIG. 11D illustrates a method of manufacturing a substrate according to a comparative example.

Referring to FIG. 11D, the photoresist layer 34 is removed to expose the top surface of the conductive post 33". The undesired thicknesses of the portions 152 of the patterned conductive layer 15 may cause a disconnection between the portions 152 and one semiconductor device (which is not shown in FIG. 11D) disposed over the dielectric layer 14 because the pads of the semiconductor device may be unable to electrically connect to the portions 152.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially, approximately, or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate for packaging a semiconductor device, comprising:
   a first dielectric layer having a first surface;
   a first patterned conductive layer adjacent to the first surface of the first dielectric layer, the first patterned conductive layer comprising a first conductive pad and a second conductive pad in contact with the semiconductor device;
   a conductive post disposed on the first conductive pad, the conductive post comprising a first portion and a second portion;
   a second patterned conductive layer disposed between the first patterned conductive layer and the conductive post; and
   a second dielectric layer disposed on the first dielectric layer, wherein at least a first portion of the second patterned conductive layer is embedded in the second dielectric layer,
   wherein the first portion and the second portion of the conductive post are exposed by the first dielectric layer,
   wherein the first portion of the conductive post has a first width corresponding to a top line width of the first portion and the second portion of the conductive post has a width, and the width of the second portion of the conductive post is greater than the first width of the first portion of the conductive post,
   wherein the second dielectric layer comprises a solder mask material, and wherein the second patterned conductive layer comprises the first portion and a second portion, and the second portion of the second patterned conductive layer is exposed by the second dielectric layer, and
   wherein the second patterned conductive layer has a T-shape structure.

2. The substrate of claim 1, wherein the first portion of the conductive post has a second width corresponding to a bottom line width of the first portion, and the second width of the first portion of the conductive post is greater than the first width of the first portion of the conductive post.

3. The substrate of claim 1, wherein a ratio of the width of the second portion of the conductive post to a height of the second portion of the conductive post is greater than or equal to about 1.

4. The substrate of claim 3, wherein the first portion of the conductive post tapers from a bottom of the first portion of the conductive post toward a top of the first portion of the conductive post.

5. The substrate of claim 1, further comprising a seed layer disposed between the conductive post and the first conductive pad.

6. The substrate of claim 1, further comprising a conductive layer, wherein a sidewall of the second portion of the conductive post is covered by the conductive layer.

7. The substrate of claim 6, wherein the conductive layer is a seed layer.

8. The substrate of claim 1, wherein the second dielectric layer comprises a photosensitive material, and the second patterned conductive layer is embedded in the second dielectric layer.

9. The substrate of claim 1, wherein the conductive post further comprises a third portion disposed between the second portion of the conductive post and the first patterned conductive layer.

10. The substrate of claim 9, wherein a portion of the third portion of the conductive post is embedded in the second dielectric layer.

11. The substrate of claim 10, wherein the third portion of the conductive post has a width, and the width of the second portion of the conductive post is greater than the width of the third portion of the conductive post.

12. The substrate of claim 1, wherein the first conductive pad is adjacent to a periphery of the substrate and the second conductive pad is adjacent to a center of the substrate.

13. The substrate of claim 1, wherein a portion of a top surface of the first portion of the conductive post defines an indentation.

14. A semiconductor device package, comprising:
   a first substrate, comprising:
      a first dielectric layer having a surface;
      a first patterned conductive layer adjacent to the surface of the first dielectric layer, the first patterned conductive layer comprising a first conductive pad adjacent to a periphery of the first substrate and a second conductive pad adjacent to a center of the first substrate;
      a conductive post disposed on the first conductive pad, the conductive post comprising a first portion and a second portion;
      a second patterned conductive layer disposed between the first patterned conductive layer and the conductive post; and
      a second dielectric layer disposed on the first dielectric layer, wherein at least a first portion of the second patterned conductive layer is embedded in the second dielectric layer,
      wherein the first portion and the second portion of the conductive post are exposed by the first dielectric layer,
      wherein the first portion of the conductive post has a width corresponding to a top line width of the first portion and the second portion of the conductive post has a width, and the width of the second portion of the conductive post is greater than the width of the first portion of the conductive post,
      the second dielectric layer comprises a solder mask material, and wherein the second patterned conductive layer comprises the first portion and a second portion, and the second portion of the second patterned conductive layer is exposed by the second dielectric layer, and
      the second patterned conductive layer has a T-shape structure,
   a semiconductor device disposed on and electrically connected to the second conductive pad;
   a second substrate electrically connected to the first conductive pad; and
   an encapsulant disposed between the first substrate and the second substrate.

15. The semiconductor device package of claim 14, wherein a ratio of the width of the second portion of the conductive post to a height of the second portion of the conductive post is greater than or equal to about 1.

16. The semiconductor device package of claim 15, wherein the first portion of the conductive post tapers from a bottom of the first portion of the conductive post toward a top of the first portion of the conductive post.

17. The substrate of claim 1, wherein the second conductive pad is exposed.

18. The substrate of claim 1, wherein the second conductive pad is configured to be in direct contact with a conductive pad of the semiconductor device.

* * * * *